US012381134B2

(12) United States Patent
Aoki et al.

(10) Patent No.: US 12,381,134 B2
(45) Date of Patent: Aug. 5, 2025

(54) SEMICONDUCTOR DEVICE WITH ARRANGEMENT FOR TERMINALS CONNECTED TO MULTIPLE SWITCHES

(71) Applicant: ROHM CO., LTD., Kyoto (JP)

(72) Inventors: Akira Aoki, Kyoto (JP); Shinsuke Takagimoto, Kyoto (JP); Masaaki Nakayama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 718 days.

(21) Appl. No.: 17/633,680

(22) PCT Filed: Aug. 6, 2020

(86) PCT No.: PCT/JP2020/030189

§ 371 (c)(1),
(2) Date: Feb. 8, 2022

(87) PCT Pub. No.: WO2021/029321

PCT Pub. Date: Feb. 18, 2021

(65) Prior Publication Data

US 2022/0319965 A1 Oct. 6, 2022

(30) Foreign Application Priority Data

Aug. 9, 2019 (JP) ................................ 2019-147638

(51) Int. Cl.

| | |
|---|---|
| ***H01L 23/495*** | (2006.01) |
| ***H01L 21/48*** | (2006.01) |
| ***H01L 23/00*** | (2006.01) |
| ***H01L 23/36*** | (2006.01) |
| ***H02M 3/00*** | (2006.01) |
| ***H10D 12/00*** | (2025.01) |
| ***H10D 84/83*** | (2025.01) |

(52) U.S. Cl.

CPC ........ *H01L 23/49562* (2013.01); *H01L 21/48* (2013.01); *H01L 23/36* (2013.01);
(Continued)

(58) Field of Classification Search

CPC ............... H01L 23/49562; H01L 23/36; H01L 23/49531; H01L 23/49568;
(Continued)

(56) References Cited

U.S. PATENT DOCUMENTS 9,673,143 B2 * 6/2017 Kamiyama ............. H01L 23/50
2003/0006434 A1 * 1/2003 Kawafuji .......... H01L 23/49575 257/E23.044
(Continued)

FOREIGN PATENT DOCUMENTS

JP 2017188517 10/2017
JP 2019067857 4/2019
(Continued)

OTHER PUBLICATIONS

International Search Report in International Appln. No. PCT/JP2020/030189, dated Nov. 2, 2020, 6 pages (with English Translation).

*Primary Examiner* — Alonzo Chambliss
(74) *Attorney, Agent, or Firm* — Fish & Richardson P.C.

(57) ABSTRACT

A semiconductor device comprises: a package having a rectangular shape when viewed in plan and including a first side, a second side parallel to the first side, a third side orthogonal to the first side and the second side, and a fourth side parallel to the third side and orthogonal to the first side and the second side; a power supply terminal provided on the first side; a power ground terminal provided on the second side; a switch output terminal provided on the second side; an upper switch connected between the power supply terminal and the switch output terminal; and a lower switch 11L connected between the switch output terminal and the power ground terminal.

30 Claims, 32 Drawing Sheets

(52) U.S. Cl.
CPC .. *H01L 23/49531* (2013.01); *H01L 23/49568* (2013.01); *H01L 23/49575* (2013.01); *H01L 24/48* (2013.01); *H01L 24/49* (2013.01); *H02M 3/003* (2021.05); *H10D 12/411* (2025.01); *H10D 84/83* (2025.01)

(58) Field of Classification Search
CPC . H01L 23/49575; H01L 21/48; H10D 12/411; H10D 84/83
See application file for complete search history.

(56) References Cited

U.S. PATENT DOCUMENTS

2003/0107120 A1* 6/2003 Connah .................. H01L 25/16 257/691
2012/0038033 A1* 2/2012 Oga .................. H01L 23/3107 257/659
2012/0256306 A1* 10/2012 Yu .................. H01L 23/49541 257/676
2013/0320818 A1 12/2013 Oga et al.
2014/0117517 A1* 5/2014 Fernando ............ H01L 23/4952 257/666
2017/0287819 A1 10/2017 Fukase et al.
2019/0103344 A1 4/2019 Fukase et al.
2019/0122966 A1 4/2019 Tanaka et al.
2020/0194353 A1 6/2020 Yokoyama et al.

FOREIGN PATENT DOCUMENTS

JP 2019079935 5/2019
WO WO 2012143964 10/2012
WO WO 2013115315 8/2013
WO WO 2018096573 5/2018

* cited by examiner

SEMICONDUCTOR DEVICE WITH ARRANGEMENT FOR TERMINALS CONNECTED TO MULTIPLE SWITCHES

TECHNICAL FIELD

The present invention disclosed herein relates to a semiconductor device.

BACKGROUND ART

Conventionally, various proposals have been made for pin configuration of semiconductor devices (see, e.g., PTL 1).

LIST OF CITATIONS

Patent Literature

PTL 1: International Publication WO 2018/096573.

SUMMARY OF THE INVENTION

Problem to be Solved by the Invention

However, in terms of optimizing the PCB (printed circuit board) layout, there has been room for further discussions about the pin configuration of semiconductor devices.

The invention disclosed herein, in view of the problem found by the present inventors, has an objective of providing a semiconductor device capable of optimizing the PCB layout.

Solution to Problem

A semiconductor device disclosed herein comprises: a package having a rectangular shape as viewed in plan and including a first side, a second side parallel to the first side, a third side orthogonal to the first side as well as the second side, and a fourth side parallel to the third side and orthogonal to the first side as well as the second side; a power supply terminal provided either on the first side or on the third side or the fourth side; a power ground terminal provided either on the second side or on the third side or the fourth side; a switch output terminal provided on the second side; an upper switch connected between the power supply terminal and the switch output terminal; and a lower switch connected between the switch output terminal and the power ground terminal (first configuration).

In the semiconductor device made up in the first configuration, preferably, the upper switch, the lower switch, and the switch output terminal are provided for each one of a plurality of channels (second configuration).

In the semiconductor device made up in the second configuration, preferably, the switch output terminals provided for each one of the plurality of channels are placed in symmetry between at least two channels (third configuration).

In the semiconductor device made up in the second or third configuration, preferably, the power supply terminal and the power ground terminal are provided for each one of the plurality of channels, respectively (fourth configuration).

In the semiconductor device made up in the fourth configuration, preferably, the power supply terminals provided for each one of the plurality of channels are placed in symmetry between at least two channels (fifth configuration) .

In the semiconductor device made up in the fourth or fifth configuration, preferably, the power ground terminals provided for each one of the plurality of channels are placed in symmetry between at least two channels (sixth configuration).

Otherwise, in the semiconductor device made up in the second or third configuration, at least one of the power supply terminal and the power ground terminal is shared by the plurality of channels (seventh configuration).

Preferably, the semiconductor device made up in any one of the first to seventh configurations further comprises a heat radiation pad exposed on a top surface of the package (eighth configuration).

In the semiconductor device made up in any one of the first to eighth configurations, preferably, a thermal resistance over a range from the semiconductor chip sealed in the package to the top surface is smaller than a thermal resistance over a range from the semiconductor chip to a bottom surface of the package (ninth configuration).

In the semiconductor device made up in any one of the first to ninth configurations, preferably, the upper switch and the lower switch are placed such unevenly as to be closer to the second side, as viewed in plan view (tenth configuration) .

In the semiconductor device made up in any one of the first to tenth configurations, preferably, the upper switch and the lower switch are placed in vertical line along a second direction orthogonal to a first direction in which the first side and the second side extend, as viewed in plan view (eleventh configuration).

In the semiconductor device made up in any one of first to eleventh configurations, preferably, the lower switch is bigger in element size than the upper switch (twelfth configuration).

In the semiconductor device made up in any one of first to twelfth configurations, preferably, the power supply terminals and the power ground terminals are both provided on the third side or the fourth side, and the power ground terminals are arrayed closer to the second side than the power supply terminals (thirteenth configuration).

Preferably, the semiconductor device made up in any one of the first to thirteenth configurations further comprises an output feedback controller for driving the upper switch and the lower switch in such fashion that an output current fed from the switch output terminal to a load agrees with a specified target value (fourteenth configuration).

In the semiconductor device made up in the fourteenth configuration, preferably, the output feedback controller performs output feedback control of a bottom-detection on-time fixed method (fifteenth configuration).

A module disclosed herein comprises: a printed circuit board; the semiconductor device made up in any one of the first to fifteenth configurations; and a load which is supplied with an output current from the semiconductor device (sixteenth configuration).

In the module made up in the sixteenth configuration, also preferably, the semiconductor device is mounted on a first main surface of the printed circuit board, and a power supply line connected to the power supply terminal, a power ground line connected to the power ground terminal, and a switch output line connected to the switch output terminal are laid down on a second main surface of the printed circuit board (seventeenth configuration).

In the module made up in the seventeenth configuration, preferably, main trunk portions of the power supply line and the power ground line are laid down in parallel and along a first direction in which the first side and the second side extend, as viewed in plan view (eighteenth configuration).

In the module made up in the eighteenth configuration, preferably, a plurality of the above-defined semiconductor devices are mounted along the first direction on the first main surface (nineteenth configuration).

In the module made up in any one of the seventeenth to nineteenth configurations, preferably, at least one of the power supply line and the power ground line is laid down so as to overlap with the semiconductor device, as viewed in plan view (twentieth configuration).

In the module made up in any one of the seventeenth to twentieth configurations, preferably, on the second main surface, a bypass capacitor is connected between the power supply line and the power ground line (twenty-first configuration).

In the module made up in the twenty-first configuration, preferably, the bypass capacitor is mounted so as to overlap with the semiconductor device as viewed in plan view (twenty-second configuration).

In the module made up in the twenty-first or twenty-second configuration, preferably, the bypass capacitor is mounted at a position where a closed loop formed in cooperation with the upper switch and the lower switch is minimized (twenty-third configuration).

In the module made up in any one of the sixteenth to twenty-third configurations, preferably, the power supply terminal, the switch output terminal, the power ground terminal, these terminals being provided for each one of the plurality of channels, as well as discrete components externally attached to these terminals are placed in symmetry between at least two channels (twenty-fourth configuration).

The module made up in any one of the sixteenth to twenty-fourth configurations, preferably, further comprises a heat sink attached to the semiconductor device (twenty-fifth configuration).

In the module made up in the sixteenth configuration, also preferably, the semiconductor device and at least part of discrete components externally attached to the semiconductor device are both mounted coplanarly on one surface of the printed circuit board (twenty-sixth configuration).

The module made up in the twenty-sixth configuration, also preferably, further comprises a heat sink attached in common to both the semiconductor device and the discrete components mounted coplanarly on one surface of the printed circuit board (twenty-seventh configuration).

The module made up in any one of the sixteenth to twenty-seventh configurations, preferably, further comprises a booster circuit for generating a boost voltage from a battery voltage and feeding the boost voltage to the power supply terminal (twenty-eighth configuration).

In the module made up in any one of the sixteenth to twenty-eighth configurations, preferably, the load is a light-emitting diode (twenty-ninth configuration).

Advantageous Effects of the Invention

According to the present invention disclosed herein, it becomes implementable to provide a semiconductor device capable of optimizing the PCB layout.

DESCRIPTION OF EMBODIMENTS

<LED (Light-Emitting Diode) Driver IC>

Figure 1:
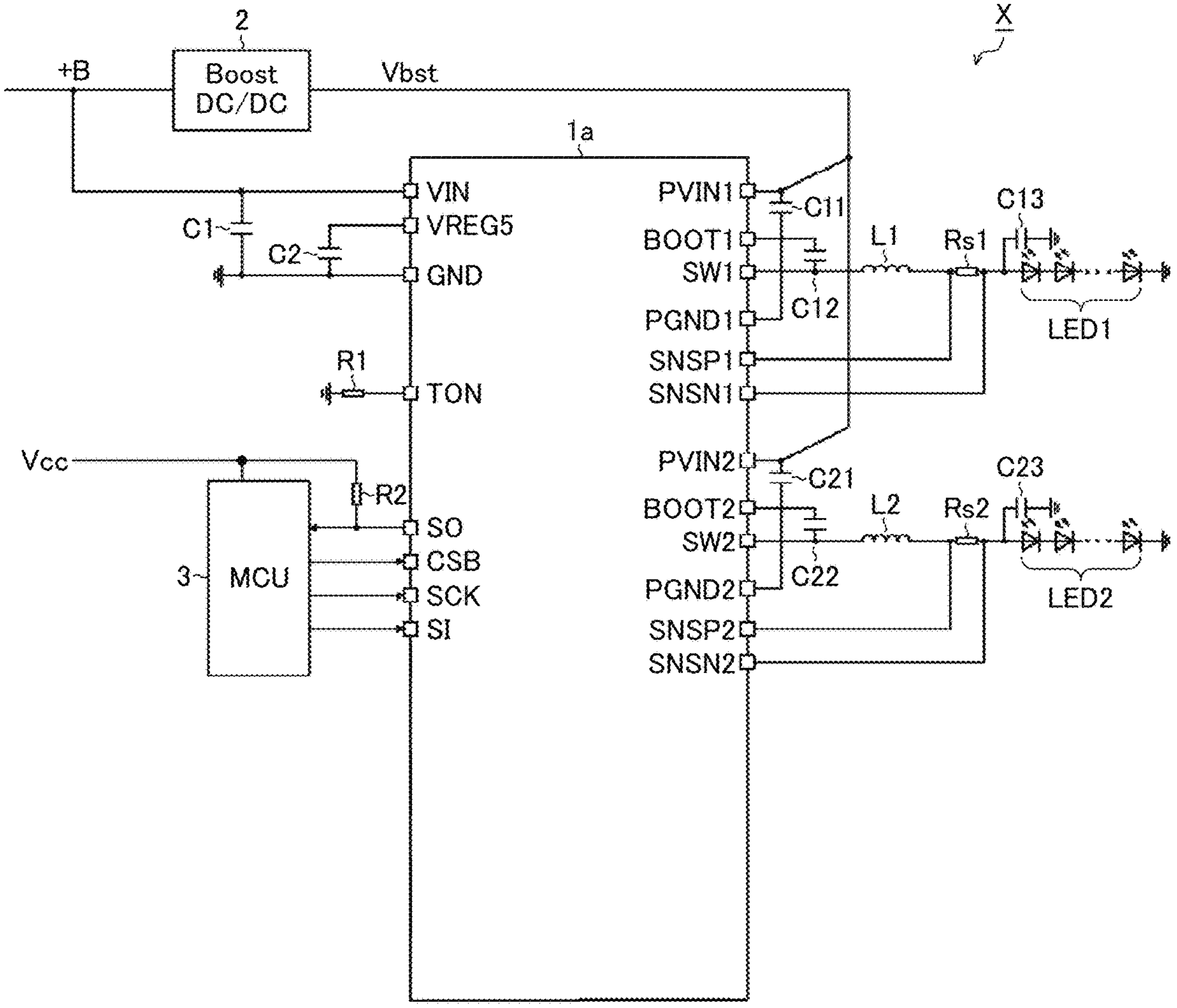
FIG. 1 is a diagram showing an application example of an LED driver IC (2*ch*)

FIG. 1 is a diagram showing a configuration example of an LED lamp module to which a 2-channel LED driver IC is applied. The LED lamp module X of this configuration example includes a 2-channel LED driver IC 1*a*, a booster circuit 2, an MCU (micro control unit) 3, light-emitting diodes LED1 and LED2 (in this figure, an LED string in which a plurality of light-emitting diode elements are connected in series), and various discrete components (capacitors C1 and C2, capacitors C11 to C13, capacitors C21 to C23, inductors L1 and L2, resistors R1 and R2, and sense resistors Rs1 and Rs2).

The LED driver IC 1*a* is a semiconductor device that lowers a boost voltage Vbst to supply electric power to the light-emitting diodes LED1 and LED2. The LED driver IC 1*a* has a plurality of external terminals (such as VIN pin, VREG5 pin, GND pin, TON pin, SO pin, CSB pin, SCK pin, SI pin, PVIN1 pin, BOOT1 pin, SW1 pin, PGND1 pin, SNSP1 pin, SNSN1 pin, PVIN2 pin, BOOT2 pin, SW2 pin, PGND2 pin, SNSP2 pin, and SNSN2 pin), as means for establishing electrical connections with outside of the IC.

The VIN pin is an input voltage supply terminal of a signal system. The VREG5 pin is an output terminal of an internal regulator. The GND pin is a ground terminal of the signal system. The TON pin is a resistor connecting terminal for setting of on time. The SO pin is a serial data output terminal for SPI (serial peripheral interface) communication. The CSB pin is a chip select input terminal for SPI communication. The SCK pin is a serial clock input terminal for SPI communication. The SI pin is a serial data input terminal for SPI communication.

The PVIN1 pin and the PVIN2 pin are input voltage supply terminals (=power supply terminals), respectively, of a power system. The BOOT1 pin and the BOOT2 pin are bootstrap capacitor connecting terminals, respectively, for drive of upper gates. The SW1 pin and the SW2 pin are switch output terminals, respectively. The PGND1 pin and the PGND2 pin are ground terminals (=power ground terminals), respectively, of the power system. The SNSP1 pin and the SNSP2 pin are output-current sense input terminals (+), respectively. The SNSN1 pin and the SNSN2 pin are output-current sense input terminals (−), respectively.

It is noted that the external terminals (PVIN1, SW1, PGND1, SNSP1, and SNSN1) with "1" added at the end of each reference sign are all for the first channel. On the other hand, the external terminals (PVIN2, SW2, PGND2, SNSP2, and SNSN2) with "2" added at the end of each reference sign are all for the second channel.

The VIN pin is connected to an application end of a battery voltage +B (e.g., 13V). The GND pin is connected to a ground end. A capacitor C1 (=input smoothing capacitor) is connected between the VIN pin and the GND pin. A capacitor C2 (=output smoothing capacitor of the internal regulator) is connected between the VREG5 pin and the GND pin. A resistor R1 (=on-time setting resistor) is connected between the TON pin and a ground end. A resistor R2 (=pull-up resistor) is connected between the SO pin and an application end of a power supply voltage Vcc (e.g., 5V). The SO pin, the CSB pin, the SCK pin, and the SI pin are each connected to the MCU 3.

The PVIN1 pin is connected to an application end of the boost voltage Vbst (e.g., 65V). The SW1 pin is connected to a first end of the inductor L1. A second end of the inductor L1 is connected to a first end of the sense resistor Rs1. A second end of the sense resistor Rs1 is connected to an anode of the light-emitting diode LED1. A cathode of the light-emitting diode LED1 is connected to a ground end. The capacitor C11 (=bypass capacitor) is connected between the PVIN1 pin and the PGND1 pin. The capacitor C12 (=bootstrap capacitor) is connected between the BOOT1 pin and the SW1 pin. The capacitor C13 (=output smoothing capacitor) is connected between the anode of the light-emitting diode LED1 and a ground end. Both ends of the sense resistor Rs1 are connected to the SNSP1 pin and the SNSN1 pin, respectively.

The PVIN2 pin is connected to an application end of the boost voltage Vbst. The SW2 pin is connected to a first end of the inductor L2. A second end of the inductor L2 is connected to a first end of the sense resistor Rs2. A second end of the sense resistor Rs2 is connected to an anode of the light-emitting diode LED2. A cathode of the light-emitting diode LED2 is connected to a ground end. The capacitor C21 (=bypass capacitor) is connected between the PVIN2 pin and the PGND2 pin. The capacitor C22 (=bootstrap capacitor) is connected between the BOOT2 pin and the SW2 pin. The capacitor C23 (=output smoothing capacitor) is connected between the anode of the light-emitting diode LED2 and a ground end. Both ends of the sense resistor Rs2 are connected to the SNSP2 pin and the SNSN2 pin, respectively.

The booster circuit 2 is a DC/DC converter that boosts the battery voltage +B to generate a boost voltage Vbst.

The MCU 3 operates on supply of the power supply voltage Vcc to perform SPI communication with the LED driver IC 1*a*.

Figure 2:
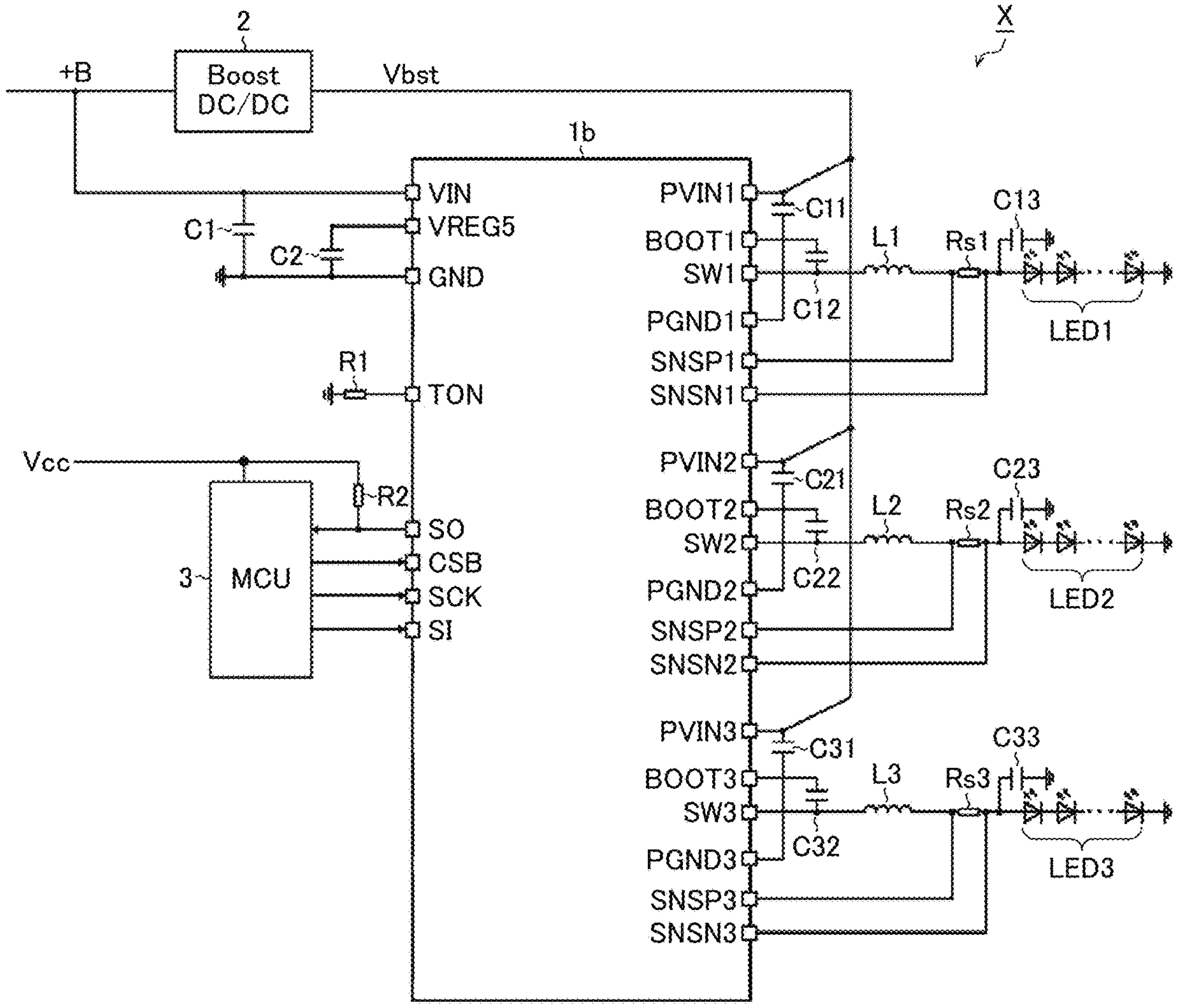
FIG. 2 is a diagram showing an application example of an LED driver IC (3*ch*)

FIG. 2 is a diagram showing a configuration example of an LED lamp module to which a 3-channel LED driver IC is applied. The LED lamp module X of this configuration example, while based on foregoing FIG. 1, has a 3-channel LED driver IC 1*b* instead of the 2-channel LED driver IC 1*a*.

In association with its 3-channel implementation, the LED driver IC 1*b* is equipped with external terminals (PVIN3 pin, BOOT3 pin, SW3 pin, PGND3 pin, SNSP3 pin, and SNSN3 pin) for a third channel in addition to the foregoing external terminals.

The LED lamp module X is also provided with a light-emitting diode LED3 for the third channel, and various discrete components (capacitors C31 to C33, inductor L3, and sense resistor Rs3) in addition to the foregoing component elements.

The PVIN3 pin is an input voltage supply terminal (=power supply terminal) of the power system. The BOOT3 pin is a bootstrap capacitor connecting terminal for drive of an upper gate. The SW3 pin is a switch output terminal. The PGND3 pin is a ground terminal (=power ground terminal) of the power system. The SNSP3 pin is an output-current sense input terminal (+). The SNSN3 pin is an output-current sense input terminal (−).

The PVIN3 pin is connected to an application end of the boost voltage Vbst. The SW3 pin is connected to a first end of the inductor L3. A second end of the inductor L3 is connected to a first end of the sense resistor Rs3. A second end of the sense resistor Rs3 is connected to an anode of the light-emitting diode LED3. A cathode of the light-emitting diode LED3 is connected to a ground end. A capacitor C31 (=bypass capacitor) is connected between the PVIN3 pin and the PGND3 pin. A capacitor C32 (=bootstrap capacitor) is connected between the BOOT3 pin and the SW3 pin. A capacitor C33 (=output smoothing capacitor) is connected between the anode of the light-emitting diode LED3 and a ground end. Both ends of the sense resistor Rs3 are connected to the SNSP3 pin and the SNSN3 pin, respectively.

It is noted that the LED driver ICs 1*a* and 1*b*, when not needed to be distinguished therebetween, may be abbreviated simply as LED driver IC 1, hereinbelow.

<Circuit Configuration>

Figure 3:
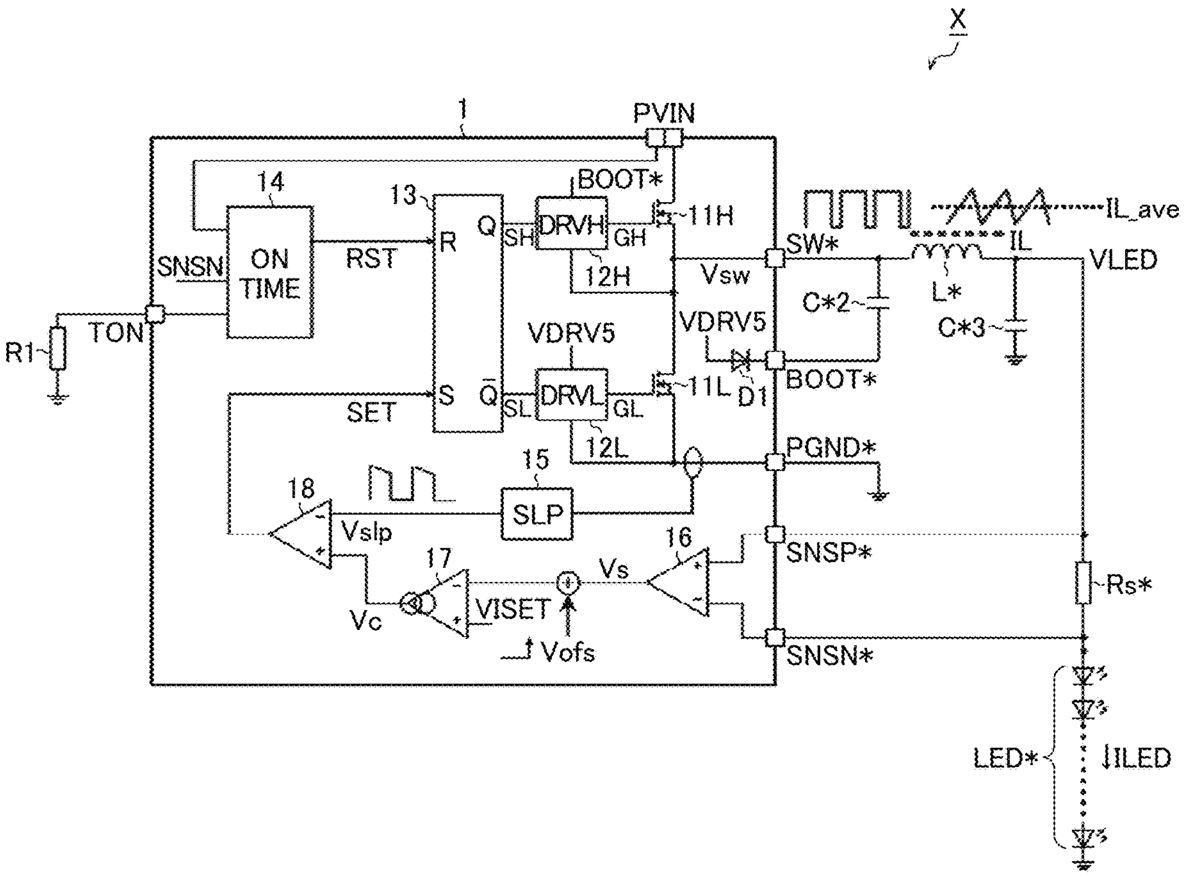
FIG. 3 is a diagram showing a circuit configuration of an LED driver IC.

FIG. 3 is a diagram showing a circuit configuration (particularly around the output stage) of the LED driver IC 1. The LED driver IC 1 of this configuration example is made up from integration of an upper switch 11H, a lower switch 11L, an upper driver 12H, a lower driver 12L, a controller 13, an on-time setter 14, a slope voltage generator 15, a sense amplifier 16, an error amplifier 17, a comparator 18, and a bootstrap diode D1, as means for driving a light-emitting diode LED* of a *-th channel (where *=1, 2 or 3). Of course, component elements (such as various types of protection circuits) other than the above-described ones may be integrated on the LED driver IC 1.

The upper switch 11H, which is connected between the PVIN pin and the SW* pin, is turned on/off in response to an upper gate signal GH. As the upper switch 11H, an NMOSFET (N-channel type metal oxide semiconductor field effect transistor) or the like may preferably be used. In that case, the upper switch 11H is turned on when GH=H (=BOOT*) and turned off when GH=L (=SW*). It is also allowable to use a PMOSFET (P-channel type MOSFET) instead of an NMOSFET as the upper switch 11H. In that case, the bootstrap diode D1, capacitor C*2, and BOOT* pins are unnecessary.

The lower switch 11L, which is connected between the SW* pin and the PGND* pin, is turned on/off in response to a lower gate signal GL. As the lower switch 11L, an NMOSFET or the like may preferably be used. In that case, the lower switch 11L is turned on when GL=H (=VDRV5) and turned off when GL=L (=PGND*).

The upper switch 11H and the lower switch 11L connected in the way described above form a half-bridge output stage that outputs a rectangular wave-shaped switch voltage Vsw from the SW* pin. Although the half-bridge output stage of the synchronous rectification method is illustrated in this figure, a diode may appropriately be used as the lower switch 11L when the diode rectification method is adopted.

The upper driver 12H generates an upper gate signal GH based on an upper control signal SH inputted from the controller 13. The high level of the upper gate signal GH corresponds to a terminal voltage (≈Vsw+VDRV5) of the BOOT* pin. On the other hand, the low level of the upper gate signal GH corresponds to a terminal voltage (≈Vsw) of the SW* pin.

The lower driver 12L generates a lower gate signal GL based on a lower control signal SL inputted from the controller 13. The high level of the lower gate signal GL corresponds to a constant voltage VDRV5 (internal power supply voltage VREG or separately given external input voltage). On the other hand, the low level of the lower gate signal GL corresponds to a terminal voltage (ground voltage) of the PGND* pin.

Including as an example an RS flip-flop that receives inputs of a set signal SET and a reset signal RST, the controller 13 generates the upper control signal SH and the lower control signal SL so as to complementarily turn on/off the upper switch 11H and the lower switch 11L.

More specifically, the controller 13 generates the upper control signal SH and the lower control signal SL in such fashion as to turn on the upper switch 11H and turn off the lower switch 11L at a rising-edge timing of the set signal SET and to turn off the upper switch 11H and turn on the lower switch 11L at a rising-edge timing of the reset signal RST.

In addition, the term "complementary" herein should be construed in such broad sense as to cover not only cases in which on/off states of the upper switch 11H and the lower switch 11L are completely inverted, but also cases in which a simultaneous off period (so-called dead time) preventive against through currents is provided.

The on-time setter 14 raises the reset signal RST to high level when a predetermined on-time Ton has elapsed from the rising-edge timing of the set signal SET (therefore also from the on-timing of the upper switch 11H). The on-time setter 14 has a function of arbitrarily setting the on-time Ton in response to a resistance value of the resistor R1 connected to the TON pin. Further, the on-time setter 14 also has a function of varying the on-time Ton so as to suppress fluctuations in a switching frequency Fsw on a basis of the terminal voltages of the PVIN pin and the SNSN pin.

The slope voltage generator 15 detects an inductor current IL flowing during an on-period of the lower switch 11L to generate a slope voltage Vslp including information as to the inductor current IL. The slope voltage Vslp becomes higher and higher with increases in the inductor current IL flowing during the on-period of the lower switch 11L, and becomes lower and lower with decreases in the inductor current IL.

The sense amplifier 16 amplifies an interterminal voltage between the SNSP* pin and the SNSN* pin (=voltage across the sense resistor Rs*) to generate a sense voltage Vs. The sense voltage Vs increases more and more with increases in an output current ILED (=average inductor current IL_ave) flowing through the sense resistor Rs*, and decreases more and more with decreases in the output current ILED.

The error amplifier 17 outputs a current corresponding to a difference between a reference voltage VISET (=analog dimming voltage) inputted to a noninverting input port (+) and a sense voltage Vs (more accurately, an added voltage of an offset voltage Vofs and the sense voltage Vs) inputted to an inverting input port (−). Then, the error amplifier 17 charges and discharges an unshown capacitor to generate a control voltage Vc. It is noted that the control voltage Vc increases when VISET>Vs and decreases when VISET<Vs.

The comparator 18 compares a slope voltage Vslp inputted to an inverting input port (−) and a control voltage Vc inputted to a noninverting input port (−) with each other to generate a set signal SET. The set signal SET goes low level when Vc<Vslp, and goes high level when Vc>Vslp. Accordingly, the lower the control voltage Vc is, the later the rising-edge timing of the set signal SET (resultantly the on-timing of the upper switch 11H as well) becomes, and conversely, the higher the control voltage Vc is, the earlier the rising-edge timing of the set signal SET becomes.

Among the above-described component elements, the upper driver 12H and the lower driver 12L, the controller 13, the on-time setter 14, the slope voltage generator 15, the sense amplifier 16, the error amplifier 17, and the comparator 18 function as an output feedback controller of a bottom-detection on-time fixed method. The upper switch 11H and the lower switch 11L are complementarily driven in such fashion that the output current ILED supplied from the switch output terminal SW* to the light-emitting diode LED* agrees with a specified target value.

<Output Feedback Control>

Figure 4:
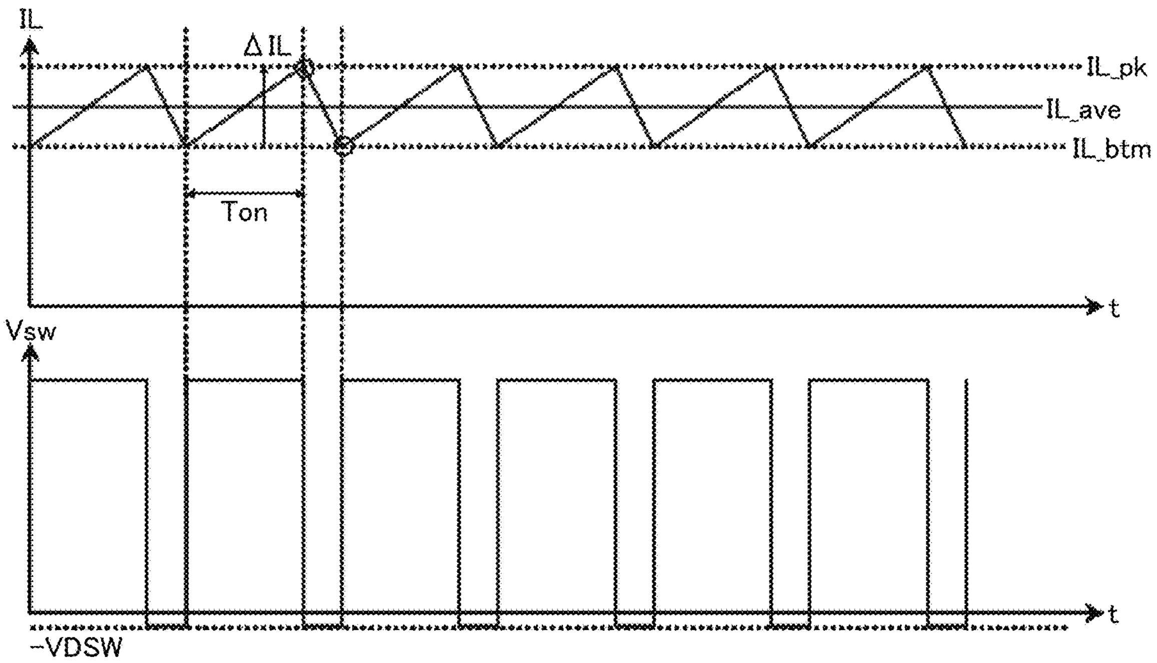
FIG. 4 is a diagram showing output feedback control of a bottom-detection on-time fixed method.

FIG. 4 is a diagram showing output feedback control of the bottom detection on-time fixed method, in which the inductor current IL and the switch voltage Vsw in order from above are charted.

While the upper switch 11H is off and the lower switch 11L is on, the switch voltage Vsw keeps at low level (=negative voltage generated between drain and source of the lower switch 11L-VDSW). In this case, the inductor current IL flowing from the PGND* pin to the SW* pin via the lower switch 11L decreases on and on along with energy release of the inductor L*.

Then, when the inductor current IL has decreased to a bottom value IL_btm corresponding to the control voltage Vc, it follows that Vc>Vslp, causing the set signal SET to rise to high level. As a result, the upper switch 11H is turned on and the lower switch 11L is turned off. In this state, since the switch voltage Vsw comes to high level (≈PVIN), the inductor current IL flowing from the PVIN pin to the SW* pin via the upper switch 11H goes on increasing.

After that, when the predetermined on-time Ton has elapsed, the reset signal RST rises to high level, the upper switch 11H is turned off, and the lower switch 11L is turned on, so that the inductor current IL turns from increasing to decreasing again. Thus, the inductor current IL results in a ripple waveform in which increase and decrease are repeated between the peak value IL_pk and the bottom value IL_btm.

In this connection, the bottom value IL_btm of the inductor current IL fluctuates in response to a difference between the sense voltage Vs (=equivalent to the average inductor current IL_ave) and the reference voltage VISET (=equivalent to the target value of the average inductor current IL_ave). Further, a ripple amplitude ΔIL (=IL_pk−IL_btm) of the inductor current IL is determined in response to the on-time Ton.

Therefore, by the above-described sequence of operations being repeated, in the LED driver IC 1, the output feedback control of the bottom detection on-time fixed method is fulfilled so that the average inductor current IL_ave (and the output current ILED as well) agrees with the specified target value.

However, the output feedback control method of the LED driver IC 1 is not necessarily limited to the above-described one. For example, a peak detection off-time fixed method or a hysteresis window method may be adopted instead of the bottom detection on-time fixed method. Otherwise, a PWM (pulse width modulation) control method may also be adopted.

<Power Loss>

Figure 5:
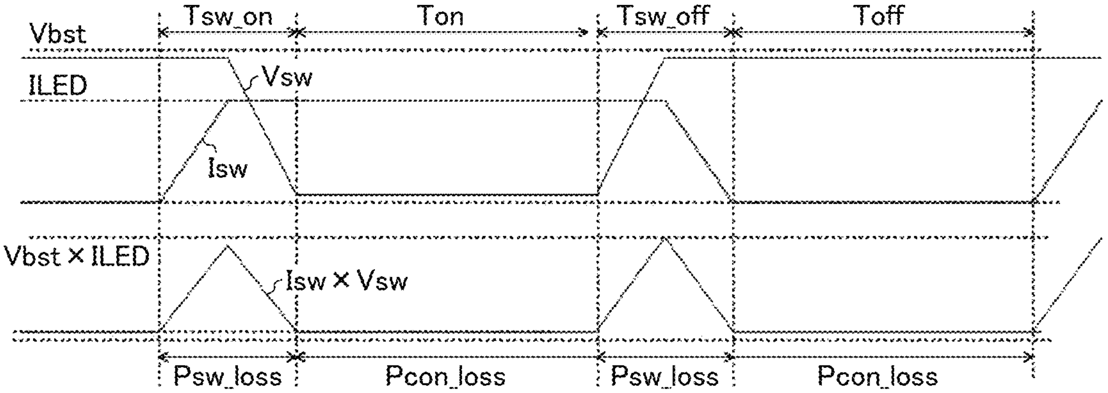
FIG. 5 is a diagram for evaluating power loss of an LED driver IC.

FIG. 5 is a diagram for evaluating power loss of the LED driver IC 1. The switch current Isw and the switch voltage Vsw are charted in upper part of this figure, and the power loss Psw (=Isw×Vsw) is charted in lower part of the figure.

As shown in this figure, in the LED driver IC 1, when the upper switch 11H and the lower switch 11L are driven complementarily, there arise a switching loss Psw_loss (=Vbst×ILED/2+(Tsw_on+Tsw_off)×Fsw) and a conduction loss Pcon_loss (=ILED×ILED×Fsw×(RonH×Ton+RonL×Toff)).

In particular, on condition that the boost voltage Vbst is several tens of V (e.g., 65 V) and the switching frequency Fsw is several MHz (e.g., 2.2 MHz), the above-described power loss (=Psw_loss+Pcon_loss) of the LED driver IC 1 becomes larger, with the result that heat generation of the LED driver IC 1 becomes larger. Consequently, the package of the LED driver IC 1 is required to have high heat radiation.

<Package>

Figure 6:
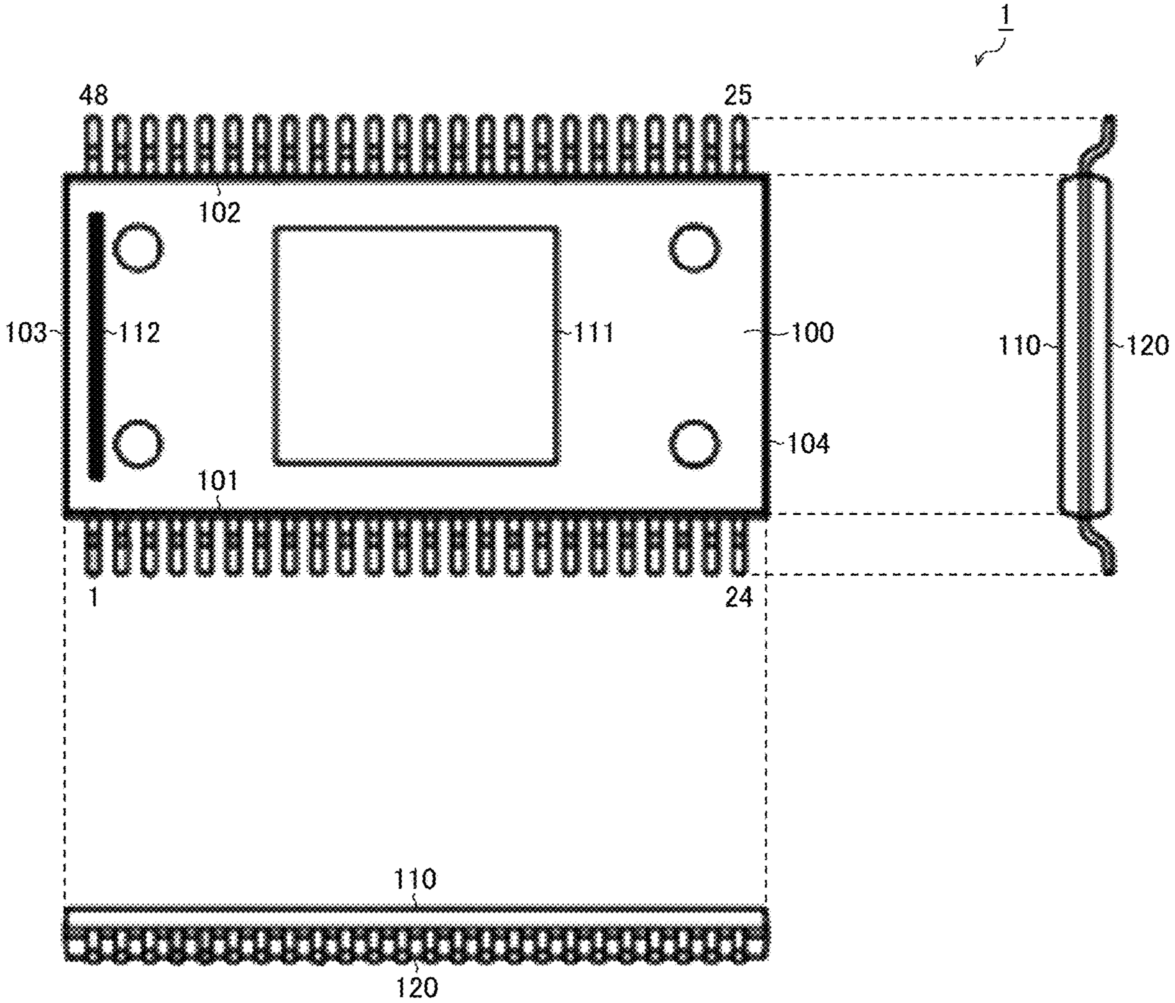
FIG. 6 is a trihedral diagram showing a package of an LED driver IC.
Figure 7:
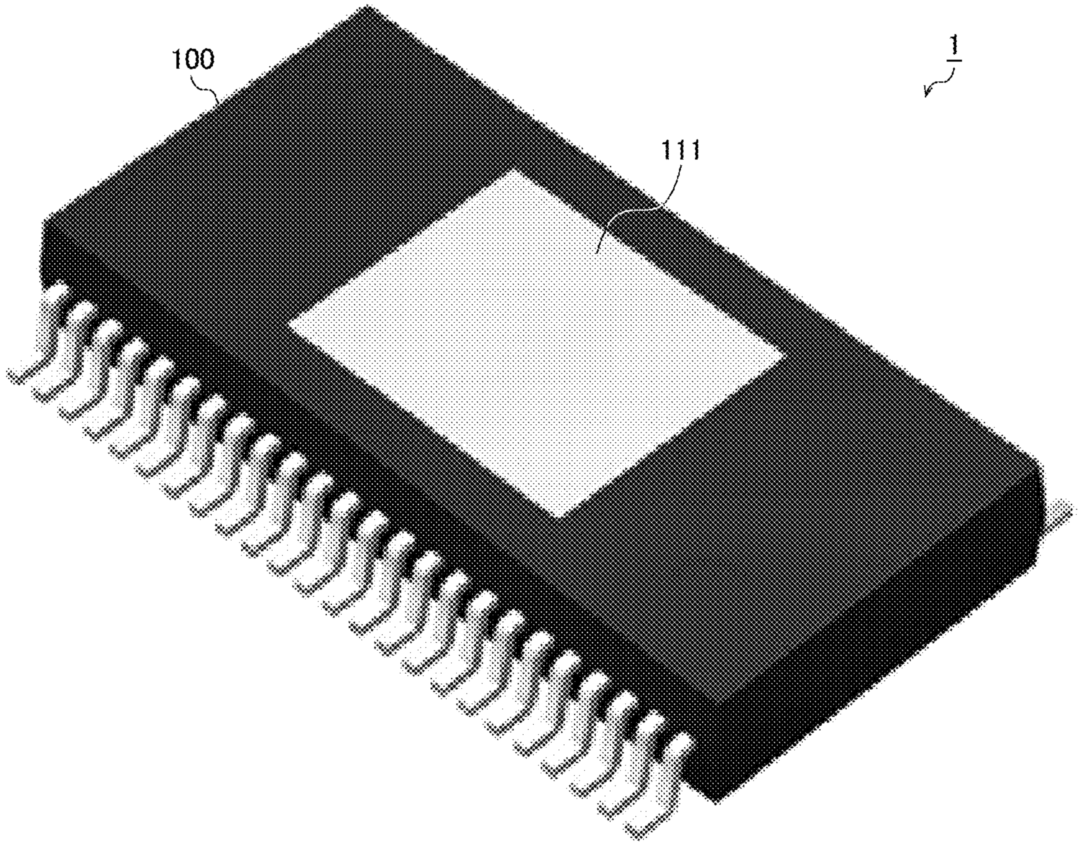
FIG. 7 is a perspective view showing a package of an LED driver IC.

FIGS. 6 and 7 are a trihedral diagram (plan, front, side face) and a perspective view, respectively, showing a package of the LED driver IC 1. The package 100 illustrated in this case is a 48-pin HTSSOP (heat-sink thin-shrink small outline package), which is formed into a rectangular shape as viewed in plan (oblong shape in plan view) having a first side 101, a second side 102, a third side 103, and a fourth side 104.

The first side 101, correspondent to a first long side (e.g., 12.5 mm), has a total of 24 external terminals provided thereon. In FIG. 6, pins 1 to 24 are arrayed side by side from left end toward right end of the first side 101.

The second side 102, correspondent to a second long side parallel to the first side 101, has a total of 24 external terminals provided thereon as in the first side 101. In FIG. 6, pins 25 to 48 are arrayed side by side from right end to left end of the second side 102.

The third side 103 is correspondent to a first short side (e.g., 6.1 mm) orthogonal to the first side 101 and the second side 102. The third side 103 has no external terminals provided thereon.

The fourth side 104 is correspondent to a second short side parallel to the third side 103 and orthogonal to the first side 102 and the second side 102. The fourth side 104 as well has no external terminals provided thereon.

The 48 external terminals are led out from long side surfaces (=correspondent to the first side 101 and the second side 102 in plan view) of the package 100 toward outside. Further, each external terminal has such a shape (so-called gull-wing shape) as to be bent halfway with a step gap formed between its root portion and tip portion as viewed in side view of the package 100.

A heat radiation pad 111 and a 1-pin mark 112 are formed on a top surface 110 (=corresponding to a first main surface not facing the printed circuit board) of the package 100. On the other hand, nothing is formed on a bottom surface 120 (=correspondent to a second main surface facing the printed circuit board) of the package 100.

The heat radiation pad 111 is such that a back surface of an island having a semiconductor chip mounted thereon is exposed on the top surface 110 of the package 100. With regard to the size of the heat radiation pad 111, appropriately, its long side length (=length of one side parallel to the long sides of the package 100) may be set to about 0.4 time (e.g., 5 mm) the first side 101 and the second side 102, while a short side length (=length of one side parallel to the short sides of the package 100) may be set to about 0.7 time (e.g., 4.2 mm) the third side 103 and the fourth side 104.

Providing the heat radiation pad 111 as described above makes it possible to improve the heat radiation property of the package 100. In particular, in the case where the heat radiation pad 111 is exposed not on the bottom surface 120 of the package 100 but on the top surface 110 of the package 100, a heat sink can be attached to the heat radiation pad 111, allowing the heat radiation property of the package 100 to be further enhanced.

Figure 8:
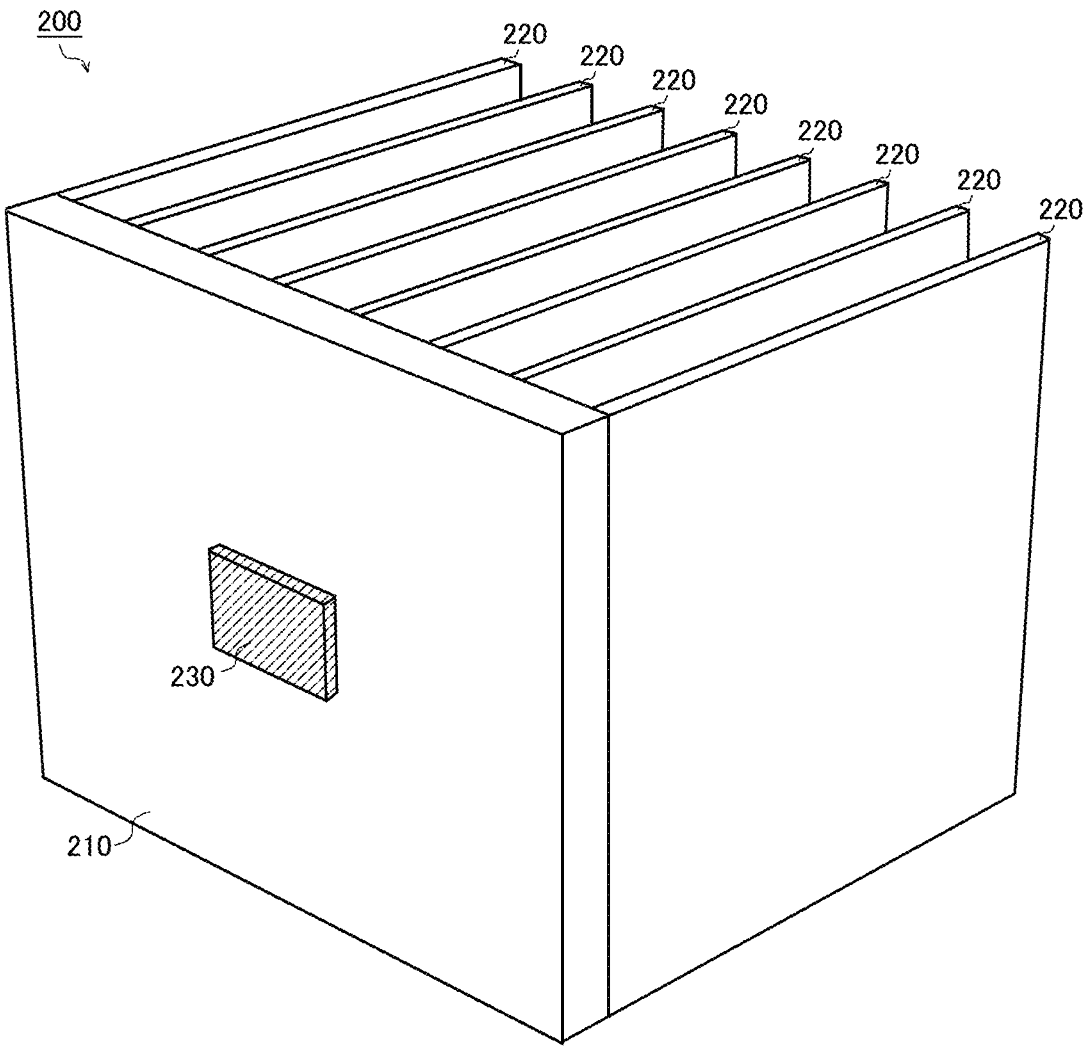
FIG. 8 is a perspective view showing an example of a heat sink attached to an LED driver IC.

FIG. 8 is a perspective view showing an example of a heat sink attached to the LED driver IC 1. The heat sink 200 of this configuration example has a base portion 210 (e.g., 60 mm×50 mm) and a plurality of heat radiation fins 220 (e.g., 50 mm×50 mm).

A plurality of heat radiation fins 220 are provided on the top surface (=correspondent to the first main surface not facing the package 100 of the LED driver IC 1) of the base portion 210. With such a configuration, surface area of the heat sink 200 can be increased, allowing the heat radiation of the package 100 to be enhanced. The base portion 210 and the heat radiation fins 220 may be formed integrally or may be formed individually and then assembled.

When the heat sink 200 is attached to the LED driver IC 1, heat radiation grease 230 may appropriately be applied to the bottom surface (=correspondent to the second main surface facing the package 100 of the LED driver IC 1) of the base portion 210 and then attached to the package 100 (particularly, heat radiation pad 111) of the LED driver IC 1.

Figure 9:
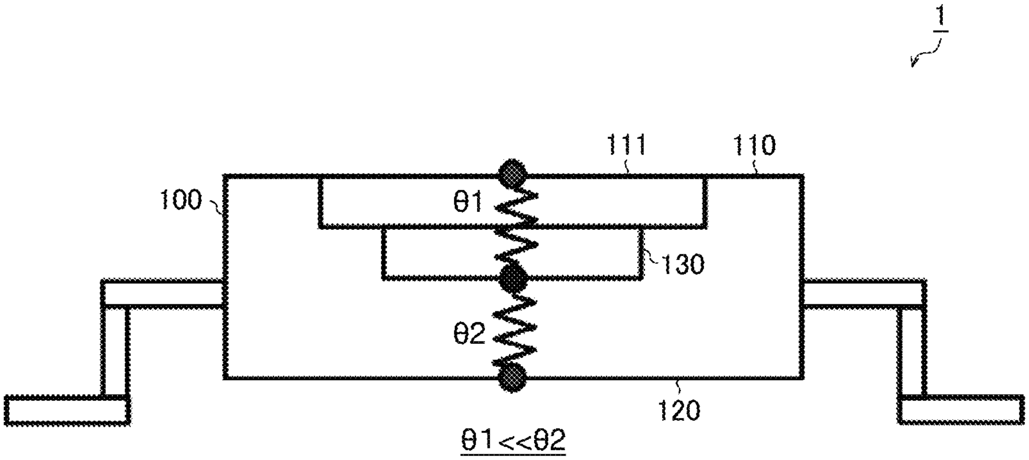
FIG. 9 is a diagram for evaluating thermal resistance of an LED driver IC.

FIG. 9 is a schematic vertical sectional view for evaluating thermal resistance of the LED driver IC 1. As shown in this figure, in the LED driver IC 1 in which the heat radiation pad 111 is exposed on the top surface 110 of the package 100, a thermal resistance θ1 over a range from the semiconductor chip 130 sealed in the package 100 to the top surface 110 becomes considerably smaller as compared with a thermal resistance θ2 over a range from the semiconductor chip 130 to the bottom surface 120 (θ1<<θ2, e.g., θ1=3° C./W, θ2=100° C./W). Accordingly, heat can be promptly dissipated from the heat radiation pad 111 (further from the heat sink 200 attached thereto), allowing the maximum permissible loss of the LED driver IC 1 to be increased.

<Pin Configuration>

Next, as to the LED driver IC 1 described hereinabove, we propose a novel pin configuration capable of optimizing the PCB layout.

Figure 10A:
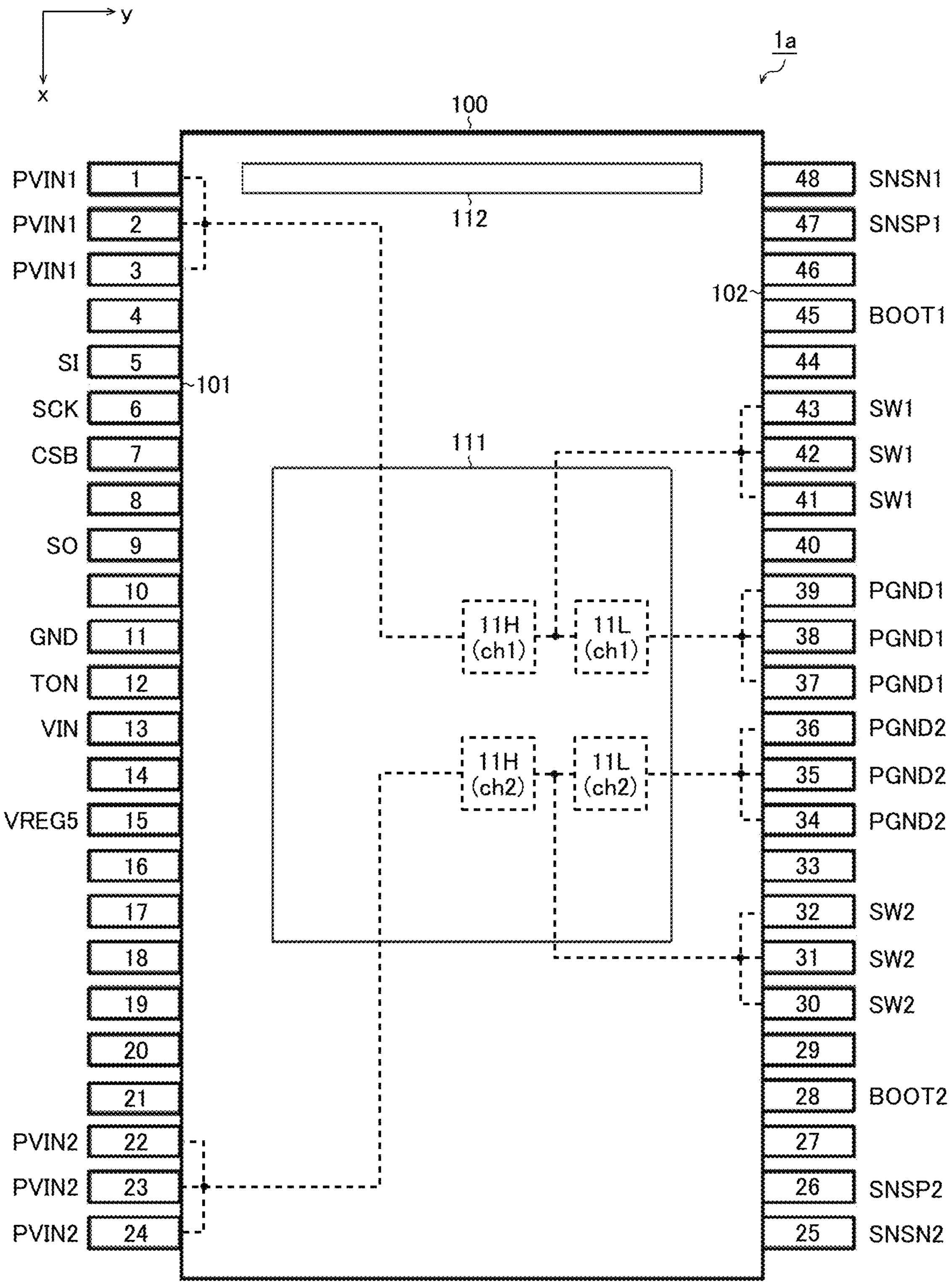
FIG. 10A is a diagram showing a pin configuration (first example) of an LED driver IC (2*ch*)

FIG. 10A is a plan view showing a pin configuration (first example) of the LED driver IC 1*a* (2*ch*). Broken lines in the figure are auxiliary lines for schematically expressing connectional relationships as to how the power supply terminals (PVIN1, PVIN2), the power ground terminals (PGND1, PGND2), and the switch output terminals (SW1, SW2) are connected with the upper switch 11H and the lower switch 11L, where the figure differs from actual interconnection patterns and device formation patterns.

Also hereinafter, as viewed in plan view of the package 100, a first direction in which the first side 101 and the second side 102 extend will be referred to as x direction (an up-down direction of the drawing sheet in this figure), and a second direction (=a direction in which the third side 103 and the fourth side 104 extend) orthogonal to the x direction will be referred to as y direction (a left-right direction of the drawing sheet in this figure).

Power supply terminals (PVIN1) of the first channel are assigned to pins 1 to 3. External terminals (SI, SCK, CSB, SO) for SPI communication are assigned to pins 5 to 7 and pin 9. Signal-system external terminals (GND, TON, VIN, VREG5) are assigned to pins 11 to 13 and pin 15. Power supply terminals (PVIN2) of the second channel are assigned to pins 22 to 24.

Output-current sense input terminals (SNSN2, SNSP2) of the second channel are assigned to pins 25 and 26. A bootstrap capacitor connecting terminal (BOOT2) of the second channel is assigned to pin 28. Switch output terminals (SW2) of the second channel are assigned to pins 30 to 32. A power ground terminal (PGND2) of the second channel is assigned to pins 34 to 36.

Power ground terminals (PGND1) of the first channel are assigned to pins 37 to 39. Switch output terminals (SW1) of the first channel are assigned to pins 41 to 43. A bootstrap capacitor connecting terminal (BOOT1) of the first channel is assigned to pin 45. Output-current sense input terminals (SNSN1, SNSP1) of the first channel are assigned to pins 47 and 48.

As described above, in the LED driver IC 1*a* of this configuration example, the power supply terminals (PVIN1 and PVIN2) are provided on the first side 101 (left side in this figure) of the package 100. On the other hand, the power ground terminals (PGND1, PGND2) and the switch output terminals (SW1, SW2) are provided on the second side 102 (right side in this figure) of the package 100.

Figure 10B:
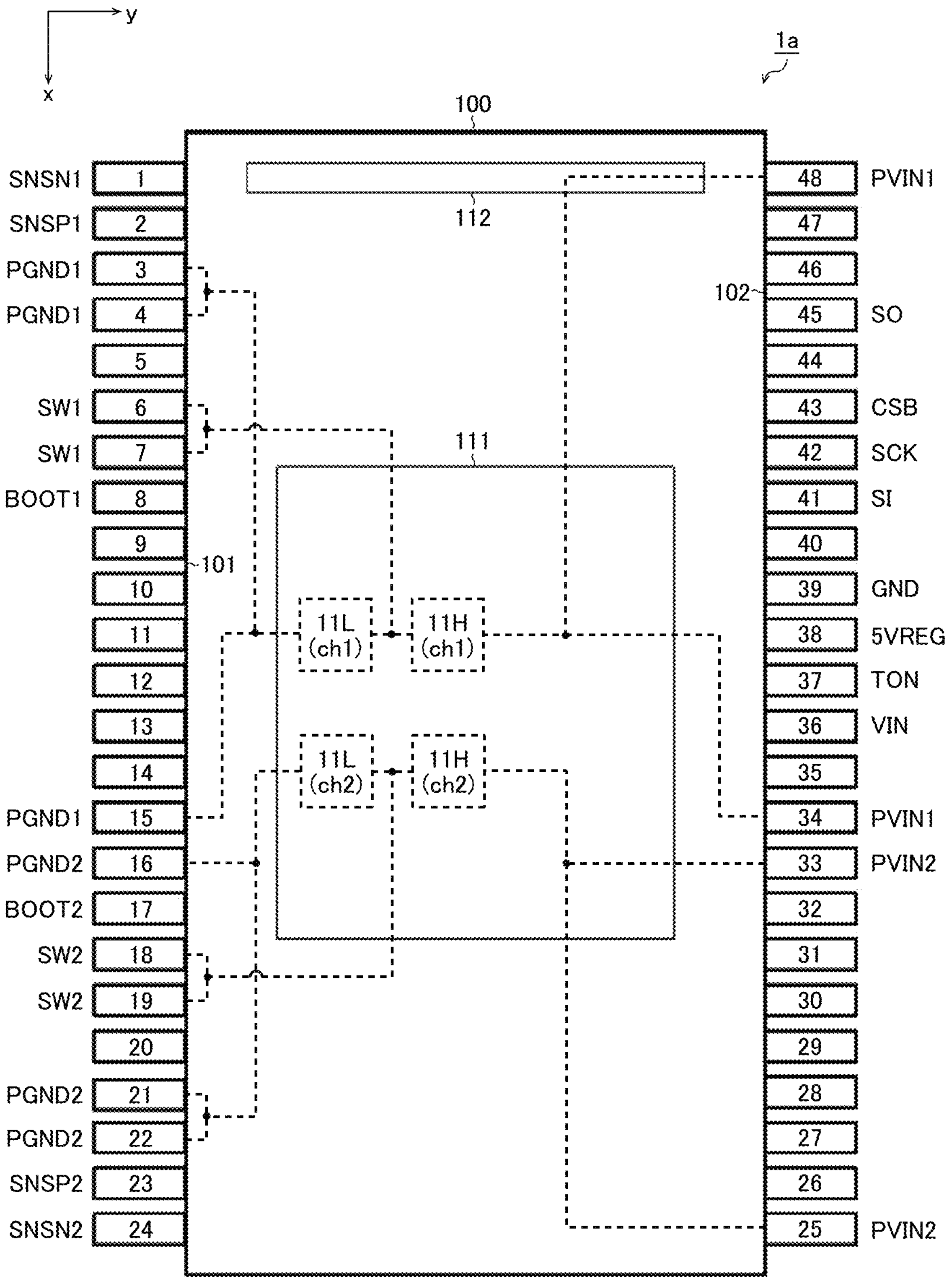
FIG. 10B is a diagram showing a pin configuration (second example) of an LED driver IC (2*ch*)

FIG. 10B is a plan view showing a pin configuration (second example) of the LED driver IC 1*a* (2*ch*). Broken lines in the figure are auxiliary lines for schematically expressing connectional relationships as to how the power supply terminals (PVIN1, PVIN2), the power ground terminals (PGND1, PGND2), and the switch output terminals (SW1, SW2) are connected with the upper switch 11H and the lower switch 11L, where the figure differs from actual interconnection patterns and device formation patterns.

Output-current sense input terminals (SNSN1, SNSP1) of the first channel are assigned to pins 1 and 2. Power ground terminals (PGND1) of the first channel are assigned to pins 3 and 4 and pin 15. Switch output terminals (SW1) of the first channel are assigned to pins 6 and 7. A bootstrap capacitor connecting terminal (BOOT1) of the first channel is assigned to pin 8.

Power ground terminals (PGND2) of the second channel are assigned to pins 16, 21 and 22. A bootstrap capacitor connecting terminal (BOOT2) of the second channel is assigned to pin 17. Switch output terminals (SW2) of the second channel are assigned to pins 18 and 19. Output-current sense input terminals (SNSP2, SNSN2) of the second channel are assigned to pins 23 and 24.

Power supply terminals (PVIN2) of the second channel are assigned to pins 25 and 33. Power supply terminals (PVIN1) of the first channel are assigned to pins 34 and 48.

External terminals (VIN, TON, 5VREG and GND) of the signal system are assigned to pins 36 to 39. External terminals (SI, SCK, CSB, SO) for SPI communication are assigned to pins 41 to 43 and pin 45.

As can be understood from FIGS. 10A and 10B, wide variations are conceivable in terms of the pin configuration of the LED driver IC 1*a* (2*ch*) unless deviations are made from the basic concept that the power supply terminals (PVIN1, PVIN2) are provided on the first side 101 (left side in this figure) of the package 100 and moreover the power ground terminals (PGND1, PGND2) and the switch output terminals (SW1, SW2) are provided on the second side 102 (right side in this figure) of the package 100.

Figure 11A:
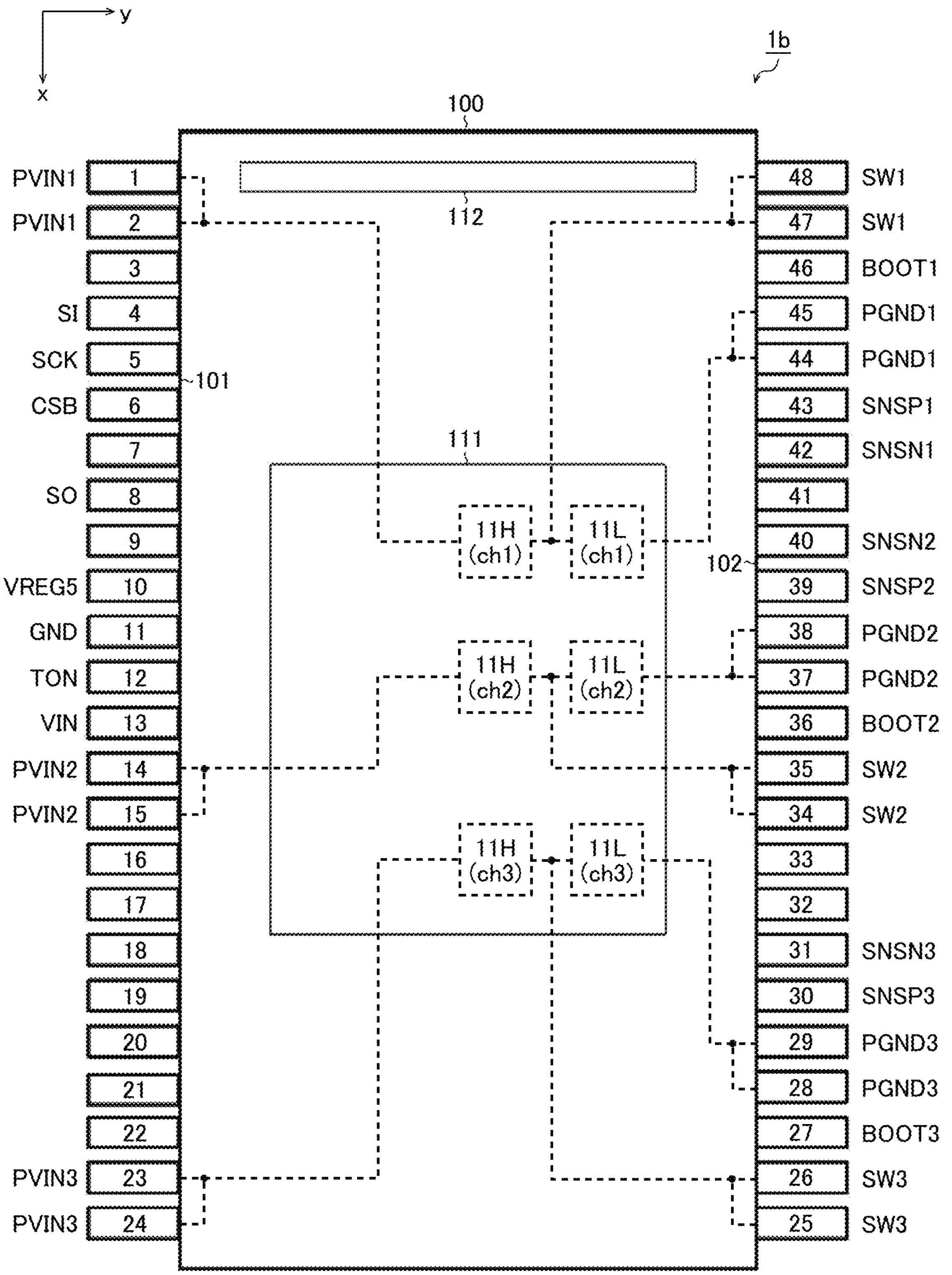
FIG. 11A is a diagram showing a pin configuration (first example) of an LED driver IC (3*ch*)

FIG. 11A is a plan view showing a pin configuration (first example) of the LED driver IC 1*b* (3*ch*). Broken lines in the figure are auxiliary lines for schematically expressing connectional relationships as to how the power supply terminals (PVIN1 to PVIN3), the power ground terminals (PGND1 to PGND3), and the switch output terminals (SW1 to SW3) are connected with the upper switch 11H and the lower switch 11L, where the figure differs from actual interconnection patterns and device formation patterns.

Power supply terminals (PVIN1) of the first channel are assigned to pins 1 and 2. External terminals (SI, SCK, CSB, and SO) for SPI communication are assigned to pins 4 to 6 and pin 8. External terminals (VREG5, GND, TON, VIN5) of the signal system are assigned to pins 10 to 13. Power supply terminals (PVIN2) of the second channel are assigned to pins 14 and 15. Power supply terminals (PVIN3) of the third channel are assigned to pins 23 and 24.

Switch output terminals (SW3) of the third channel are assigned to pins 25 and 26. A bootstrap capacitor connecting terminal (BOOT3) of the third channel is assigned to pin 27. Power ground terminals (PGND3) of the third channel are assigned to pins 28 and 29. Output-current sense input terminals (SNSP3, SNSN3) of the third channel are assigned to pins 30 and 31.

Switch output terminals (SW2) of the second channel are assigned to pins 34 and 35. A bootstrap capacitor connecting terminal (BOOT2) of the second channel is assigned to pin 36. Power ground terminals (PGND2) of the second channel are assigned to pins 37 and 38. Output-current sense input terminals (SNSP2, SNSN2) of the second channel are assigned to pins 39 and 40.

Output-current sense input terminals (SNSN1, SNSP1) of the first channel are assigned to pins 42 and 43. Power ground terminals (PGND1) of the first channel are assigned to pins 44 and 45. A bootstrap capacitor connecting terminal (BOOT1) of the first channel is assigned to pin 46. Switch output terminals (SW1) of the first channel are assigned to pins 47 and 48.

As described above, in the LED driver IC 1*b* of this configuration example, the power supply terminals (PVIN1 to PVIN3) are provided on the first side 101 (left side in this figure) of the package 100. On the other hand, the power ground terminals (PGND1 to PGND3) and the switch output terminals (SW1 to SW3) are provided on the second side 102 (right side in this figure) of the package 100.

Figure 11B:
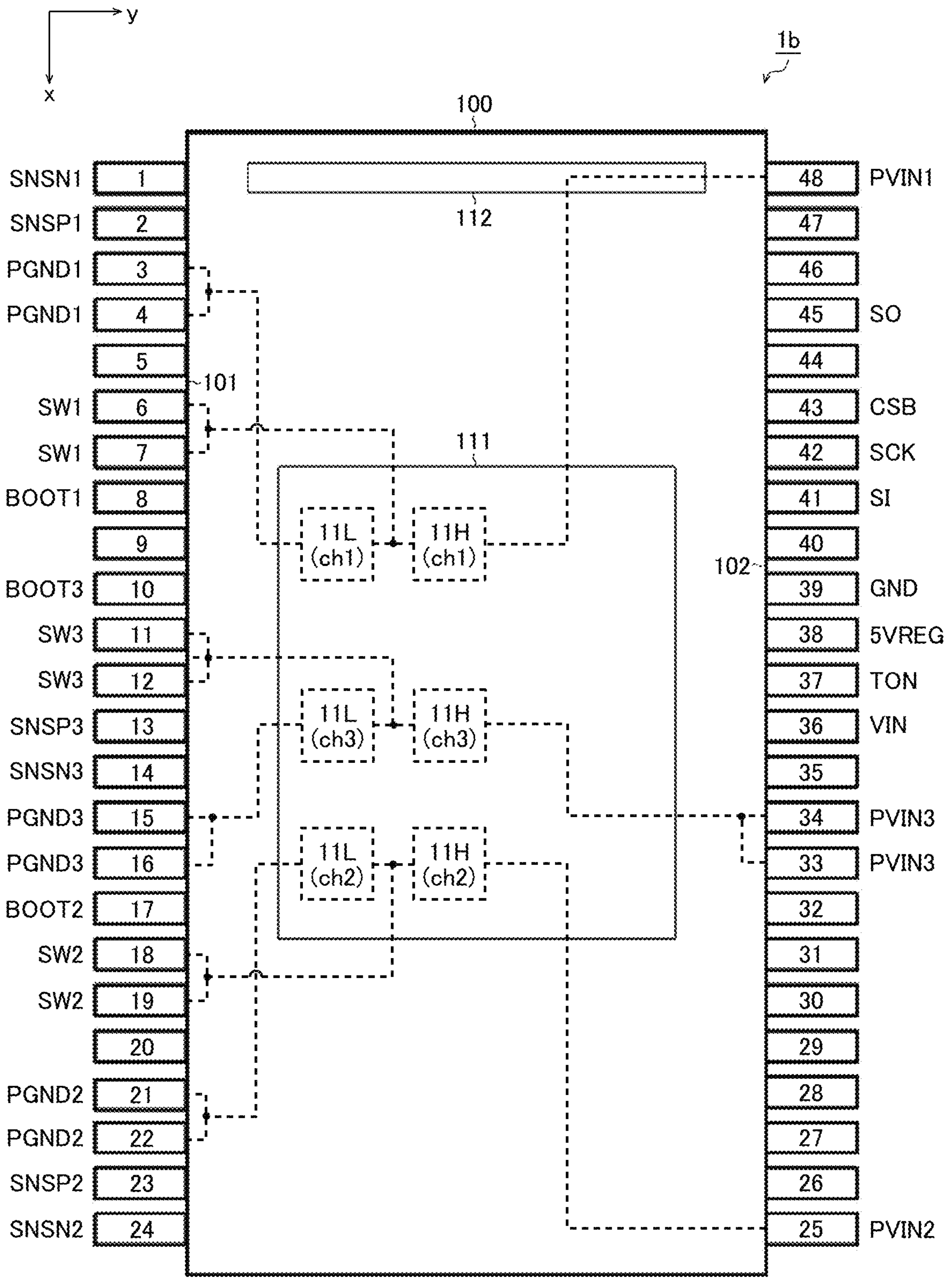
FIG. 11B is a diagram showing a pin configuration (second example) of an LED driver IC (3*ch*)

FIG. 11B is a plan view showing a pin configuration (second example) of the LED driver IC 1*b* (3*ch*). Broken lines in the figure are auxiliary lines for schematically expressing connectional relationships as to how the power supply terminals (PVIN1, PVIN2), the power ground terminals (PGND1, PGND2), and the switch output terminals (SW1 to SW3) are connected with the upper switch 11H and the lower switch 11L, where the figure differs from actual interconnection patterns and device formation patterns.

Output-current sense input terminals (SNSN1, SNSP1) of the first channel are assigned to pins 1 and 2. Power ground terminals PGND1 of the first channel are assigned to pins 3 and 4. Switch output terminals (SW1) of the first channel are assigned to pins 6 and 7. A bootstrap capacitor connecting terminal (BOOT1) of the first channel is assigned to pin 8.

A bootstrap capacitor connecting terminal (BOOT3) of the third channel is assigned to pin 10. Switch output terminals (SW3) of the third channel are assigned to pins 11 and 12. Output-current sense input terminals (SNSP3, SNSN3) of the third channel are assigned to pins 13 and 14. Power ground terminals PGND3 of the third channel are assigned to pins 15 and 16.

A bootstrap capacitor connecting terminal (BOOT2) of the second channel is assigned to pin 17. Switch output terminals (SW2) of the second channel are assigned to pins 18 and 19. Power ground terminals (PGND2) of the second channel are assigned to pins 21 and 22. Output-current sense input terminals (SNSP2, SNSN2) of the second channel are assigned to pins 23 and 24.

A power supply terminal (PVIN2) of the second channel is assigned to pin 25. Power supply terminals (PVIN3) of the third channel are assigned to pins 33 and 34. A power supply terminal (PVIN1) of the first channel is assigned to pin 48.

External terminals (VIN, TON, 5VREG and GND) of the signal system are assigned to pins 36 to 39. External terminals (SI, SCK, CSB, SO) for SPI communication are assigned to pins 41 to 43 and pin 45.

As can be understood from FIGS. 11A and 11B, wide variations are conceivable in terms of the pin configuration of the LED driver IC 1*b* (3*ch*) unless deviations are made from the basic concept that the power supply terminals (PVIN1 to PVIN3) are provided on the first side 101 (left side in this figure) of the package 100 and moreover the power ground terminals (PGND1 to PGND3) and the switch output terminals (SW1 to SW3) are provided on the second side 102 (right side in this figure) of the package 100.

<Internal Structure>

Figure 12:
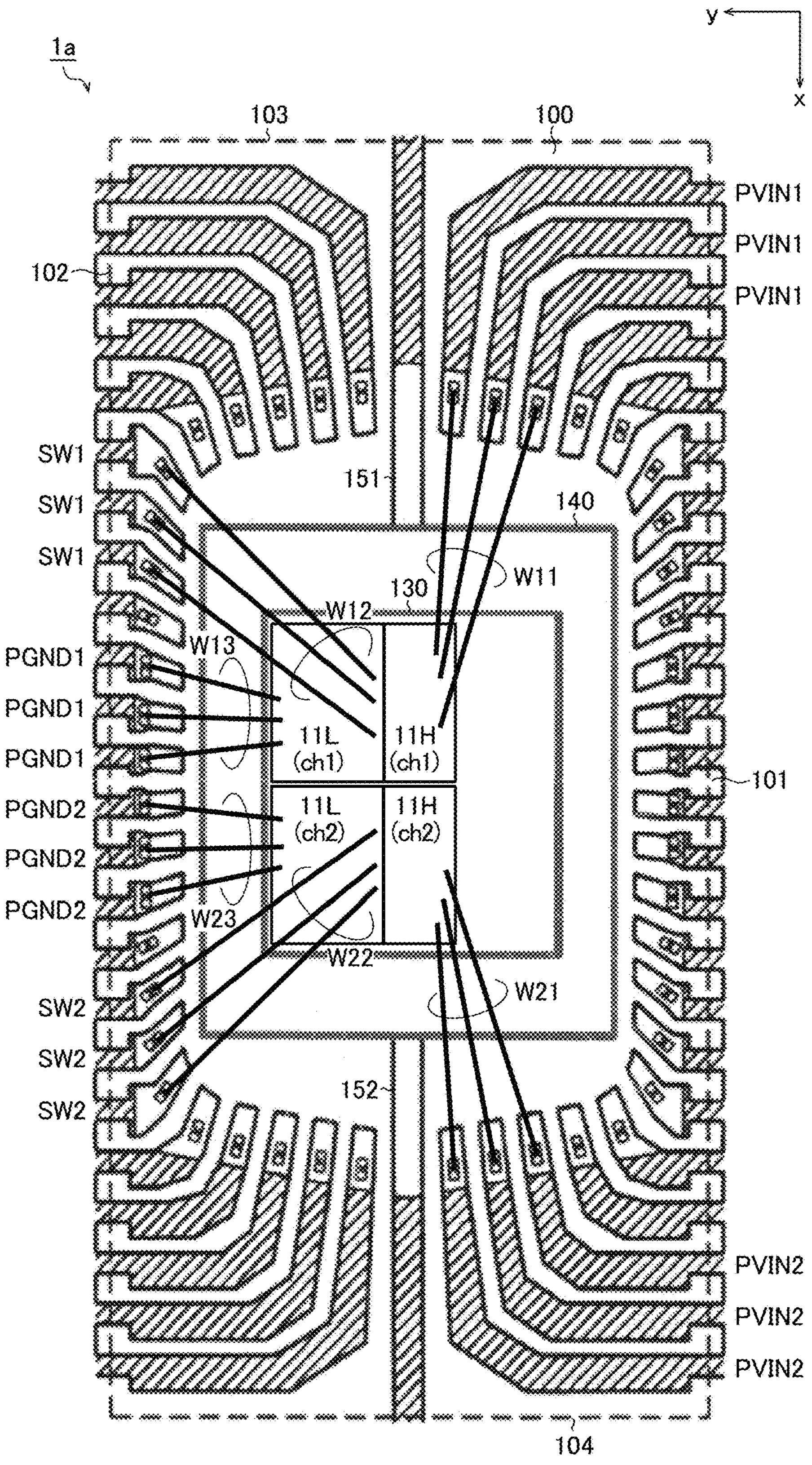
FIG. 12 is a diagram showing an internal structure of the LED driver IC (2*ch*) shown in FIG. 10A.

FIG. 12 is a bottom perspective view (=a view of the package 100 as viewed perspectively through the bottom surface 120) showing an internal structure of the LED driver IC 1*a* (2*ch*) shown in FIG. 10A. Therefore, in this figure, converse to FIG. 10A described above, the first side 101 turns to the right side and the second side 102 turns to the left side.

The semiconductor chip 130, in which the upper switch 11H (ch1) and the lower switch 11L (ch1) of the first channel as well as the upper switch 11H (ch2) and the lower switch 11L (ch2) of the second channel are integrated respectively, is die-bonded to an island 140 having a rectangular shape as viewed in plan. The island 140 is supported inside the package 100 by a support frame 151 extending toward the third side 103 and a support frame 152 extending toward the fourth side 104. A back surface of the island 140 is exposed, as the above-described heat radiation pad 111, on the top surface 110 of the package 100.

Wires W11 are stretched between a drain pad of the upper switch 11H (ch1) and the three PVIN1 pins, respectively. Wires W12 are stretched between a source pad of the upper switch 11H (ch1) plus a drain pad of the lower switch 11L (ch1) and the three SW1 pins, respectively. Wires W13 are stretched between a source pad of the lower switch 11L (ch1) and the three PGND1 pins, respectively.

Wires W21 are stretched between a drain pad of the upper switch 11H (ch2) and the three PVIN2 pins, respectively. Wires W22 are stretched between a source pad of the upper switch 11H (ch2) plus a drain pad of the lower switch 11L (ch2) and the three SW2 pins, respectively. Wires W23 are stretched between a source pad of the lower switch 11L (ch2) and the three PGND2 pins, respectively.

The lower switches 11L (ch1/ch2) are each larger in element size than the upper switches 11H (ch1/ch2). Such an element design makes it possible to enhance current capacity of the lower switches 11L (ch1/ch2) over current capacity of the upper switches 11H (ch1/ch2). For example, when it is desired to keep output power constant, there arises a need for decreasing the output current ILED more and more with increasing output voltage VLED and, conversely, increasing the output current ILED more and more with decreasing output voltage VLED. That is, because of a need for delivering the output current ILED that increases more and more with decreasing on-duty of the half-bridge output stage, the above-described element design becomes effective.

Also, the upper switch 11H (ch1) and the lower switch 11L (ch1) as well as the upper switch 11H (ch2) and the lower switch 11L (ch2) are vertically placed in order shown in the figure along the y direction orthogonal to the first side 101 as viewed in plan view of the semiconductor chip 130.

A switch formation region in which the upper switches 11H (ch1/ch2) and the lower switches 11L (ch1/ch2) are formed is unevenly placed closer to the second side 102 of the package 100 as viewed in plan view of the semiconductor chip 130.

Further, the upper switch 11H (ch1) and the lower switch 11L (ch1) of the first channel are placed closer to the third side 103 of the package 100, as viewed in plan view of the semiconductor chip 130, so as to be as close as possible to the external terminals (PVIN1, PGND1, SW1) of the first channel.

On the other hand, the upper switch 11H (ch2) and the lower switch 11L (ch2) of the second channel are placed closer to the fourth side 104 of the package 100, as viewed in plan view of the semiconductor chip 130, so as to be as close as possible to the external terminals (PVIN2, PGND, SW2) of the second channel.

By adopting such an element layout, the wires W11 to W13 and the wires W21 to W23 can be shortened in length to minimums, respectively, so that their resistance components, capacitance components, and inductance components can be reduced to the utmost.

Figure 13A:
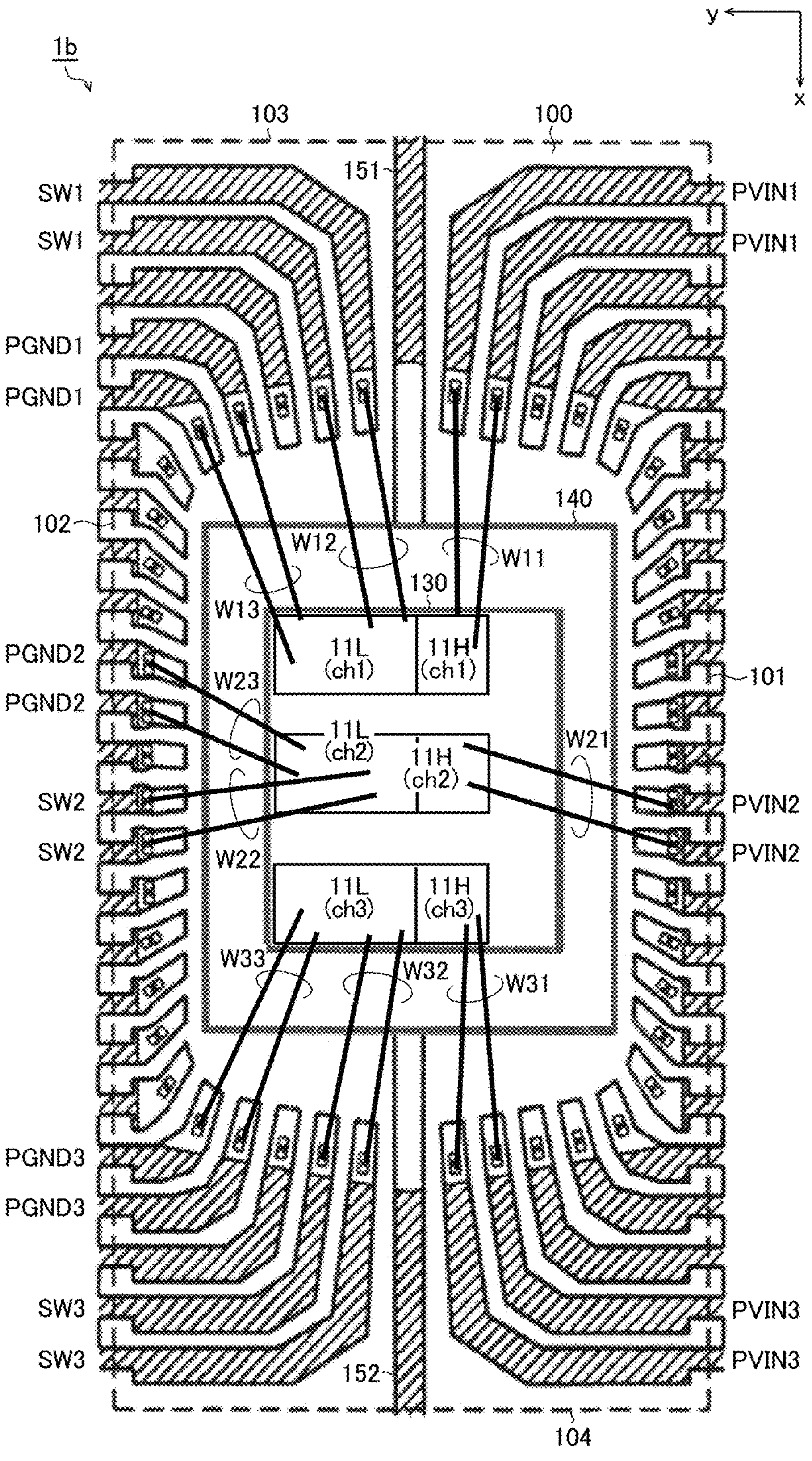
FIG. 13A is a view showing an internal structure of the LED driver IC (3*ch*) shown in FIG. 11A.

FIG. 13A is a bottom perspective view showing an internal structure of the LED driver IC 1*b* (3*ch*) shown in FIG. 11A. Therefore, converse to FIG. 11A described above, the first side 101 turns to the right side and the second side 102 turns to the left side.

The upper switch 11H (ch1) and the lower switch 11L (ch1) of the first channel, the upper switch 11H (ch2) and the lower switch 11L (ch2) of the second channel, and the upper switch 11H (ch3) and the lower switch 11L (ch3) of the third channel are integrated in the semiconductor chip 130.

Wires W11 are stretched between a drain pad of the upper switch 11H (ch1) and the two PVIN1 pins, respectively. Wires W12 are stretched between a source pad of the upper switch 11H (ch1) plus a drain pad of the lower switch 11L (ch1) and the two SW1 pins, respectively. Wires W13 are stretched between a source pad of the lower switch 11L (ch1) and the two PGND1 pins, respectively.

Wires W21 are stretched between a drain pad of the upper switch 11H (ch2) and the two PVIN2 pins, respectively. Wires W22 are stretched between a source pad of the upper switch 11H (ch2) plus a drain pad of the lower switch 11L (ch2) and the two SW2 pins, respectively. Wires W23 are stretched between a source pad of the lower switch 11L (ch2) and the two PGND2 pins, respectively.

Wires W31 are stretched between a drain pad of the upper switch 11H (ch3) and the two PVIN3 pins, respectively. Wires W32 are stretched between a source pad of the upper switch 11H (ch3) plus a drain pad of the lower switch 11L (ch3) and the two SW3 pins, respectively. Wires W33 are stretched between a source pad of the lower switch 11L (ch3) and the two PGND3 pins, respectively.

The lower switches 11L (ch1/ch2/ch3) are each larger in element size than the upper switches 11H (ch1/ch2/ch3). Such an element design makes it possible to enhance current capacity of the lower switches 11L (ch1/ch2/ch3) over current capacity of the upper switches 11H (ch1/ch2/ch3). For example, when it is desired to keep output power constant, there arises a need for decreasing the output current ILED more and more with increasing output voltage VLED and, conversely, increasing the output current ILED more and more with decreasing output voltage VLED. That is, because of a need for delivering the output current ILED that increases more and more with decreasing on-duty of the half-bridge output stage, the above-described element design becomes effective.

Also, the upper switch 11H (ch1) and the lower switch 11L (ch1), the upper switch 11H (ch2) and the lower switch 11L (ch2), as well as the upper switch 11H (ch3) and the lower switch 11L (ch3) are vertically placed in order shown in the figure along the y direction orthogonal to the first side 101 as viewed in plan view of the semiconductor chip 130.

A switch formation region in which the upper switches 11H (ch1/ch2/ch3) and the lower switches 11L (ch1/ch2/ch3) are formed is unevenly placed closer to the second side 102 of the package 100 as viewed in plan view of the semiconductor chip 130.

Further, the upper switch 11H (ch1) and the lower switch 11L (ch1) of the first channel are placed closer to the third side 103 of the package 100, as viewed in plan view of the semiconductor chip 130, so as to be as close as possible to the external terminals (PVIN1, PGND1, SW1) of the first channel.

On the other hand, the upper switch 11H (ch2) and the lower switch 11L (ch2) of the second channel are placed in y-direction central portion, as viewed in plan view of the semiconductor chip 130, so as to be as close as possible to the external terminals (PVIN2, PGND2, SW2) of the second channel.

Also, the upper switch 11H (ch3) and the lower switch 11L (ch3) of the third channel are placed closer to the fourth side 104 of the package 100, as viewed in plan view of the semiconductor chip 130, so as to be as close as possible to the external terminals (PVIN3, PGND3, SW3) of the third channel.

By adopting such an element layout, the wires W11 to W13, the wires W21 to W23, and the wires W31 to W33 can be shortened in length to minimums, respectively, so that their resistance components, capacitance components, and inductance components can be reduced to the utmost.

Figure 13B:
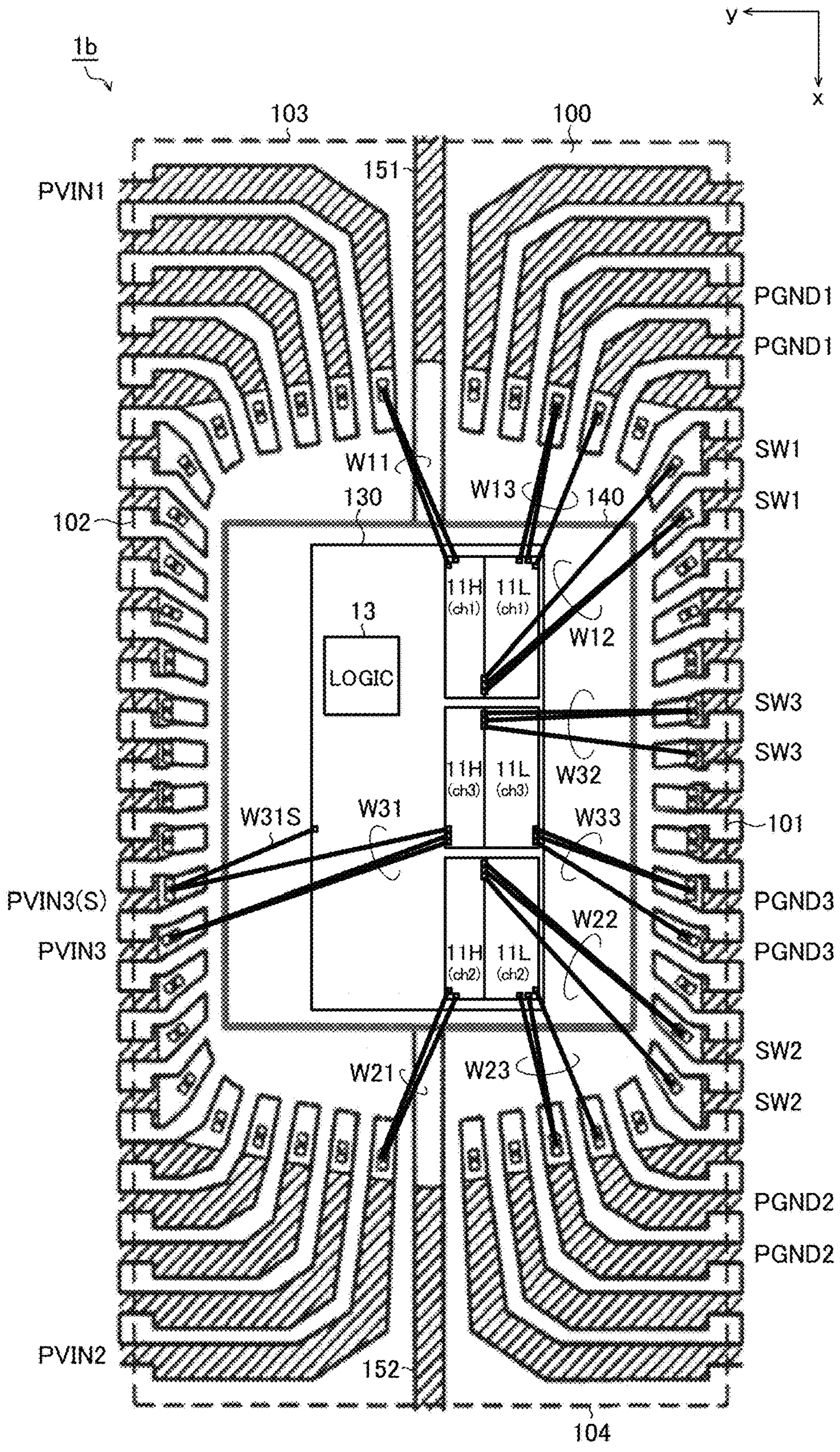
FIG. 13B is a view showing an internal structure of the LED driver IC (3*ch*) shown in FIG. 11B.

FIG. 13B is a bottom perspective view showing an internal structure of the LED driver IC 1*b* (3*ch*) shown in FIG. 11B. Therefore, converse to FIG. 11B described above, the first side 101 turns to the right side and the second side 102 turns to the left side.

The upper switch 11H (ch1) and the lower switch 11L (ch1) of the first channel, the upper switch 11H (ch2) and the lower switch 11L (ch2) of the second channel, and the upper switch 11H (ch3) and the lower switch 11L (ch3) of the third channel are integrated in the semiconductor chip 130.

A wire W11 is stretched between a drain pad of the upper switch 11H (ch1) and the PVIN1 pin. Wires W12 are stretched between a source pad of the upper switch 11H (ch1) plus a drain pad of the lower switch 11L (ch1) and the two SW1 pins, respectively. Wires W13 are stretched between a source pad of the lower switch 11L (ch1) and the two PGND1 pins, respectively.

Wires W21 are stretched between a drain pad of the upper switch 11H (ch2) and the two PVIN2 pins, respectively. Wires W22 are stretched between a source pad of the upper switch 11H (ch2) plus a drain pad of the lower switch 11L (ch2) and the two SW2 pins, respectively. Wires W23 are stretched between a source pad of the lower switch 11L (ch2) and the two PGND2 pins, respectively.

Wires W31 are stretched between the drain pad of the upper switch 11H (ch3) and the PVIN3 pin plus the PVIN3(S) pin, respectively. A wire W31S is stretched between the PVIN3(S) pin and a sub-pad of the semiconductor chip 130. Wires W32 are stretched between the source pad of the upper switch 11H (ch3) plus the drain pad of the lower switch 11L (ch3) and the two SW3 pins, respectively. Wires W33 are stretched between the source pad of the lower switch 11L (ch3) and the two PGND3 pins, respectively.

The lower switches 11L (ch1/ch2/ch3) are each larger in element size than the upper switches 11H (ch1/ch2/ch3). Such an element design makes it possible to enhance current capacity of the lower switches 11L (ch1/ch2/ch3) over current capacity of the upper switches 11H (ch1/ch2/ch3). For example, when it is desired to keep output power constant, there arises a need for decreasing the output current ILED more and more with increasing output voltage VLED and, conversely, increasing the output current ILED more and more with decreasing output voltage VLED. That is, because of a need for delivering the output current ILED that increases more and more with decreasing on-duty of the half-bridge output stage, the above-described element design becomes effective.

Also, the upper switch 11H (ch1) and the lower switch 11L (ch1), the upper switch 11H (ch2) and the lower switch 11L (ch2), as well as the upper switch 11H (ch3) and the lower switch 11L (ch3) are vertically placed in order shown in the figure along the y direction orthogonal to the first side 101 as viewed in plan view of the semiconductor chip 130.

A switch formation region in which the upper switches 11H (ch1/ch2/ch3) and the lower switches 11L (ch1/ch2/ch3) are formed is unevenly placed closer to the first side 101 of the package 100 as viewed in plan view of the semiconductor chip 130. Also, a logic formation region in which the controller 13 and the like are formed is unevenly placed closer to the second side of the package 100 as viewed in plan view of the semiconductor chip 130.

Further, the upper switch 11H (ch1) and the lower switch 11L (ch1) of the first channel are placed closer to the third side 103 of the package 100, as viewed in plan view of the semiconductor chip 130, so as to be as close as possible to the external terminals (PVIN1, PGND1, SW1) of the first channel.

On the other hand, the upper switch 11H (ch2) and the lower switch 11L (ch2) of the second channel are placed closer to the fourth side 104 of the package 100, as viewed in plan view of the semiconductor chip 130, so as to be as close as possible to the external terminals (PVIN2, PGND2, SW2) of the second channel.

Also, the upper switch 11H (ch3) and the lower switch 11L (ch3) of the third channel are placed in y-direction central portion, as viewed in plan view of the semiconductor chip 130, so as to be as close as possible to the external terminals (PVIN3, PGND3, SW3) of the third channel.

By adopting such an element layout, the wires W11 to W13, the wires W21 to W23, and the wires W31 to W33 can be shortened in length to minimums, respectively, so that their resistance components, capacitance components, and inductance components can be reduced to the utmost.

Further, in this layout, as compared with FIG. 13A described above, the upper switches 11H (ch1/ch2/ch3) and the lower switches 11L (ch1/ch2/ch3) are formed each in vertically elongated shape (shape with the X-direction length larger than the y-direction length). As a result, the PGND pins can be placed on one side closer to an end of the first side 101 more easily than the SW1 to SW3 pins.

<PCB Layout>

Next, optimization of the PCB layout implemented by the above-described pin configurations will be described in detail with specific examples.

Figure 14A:
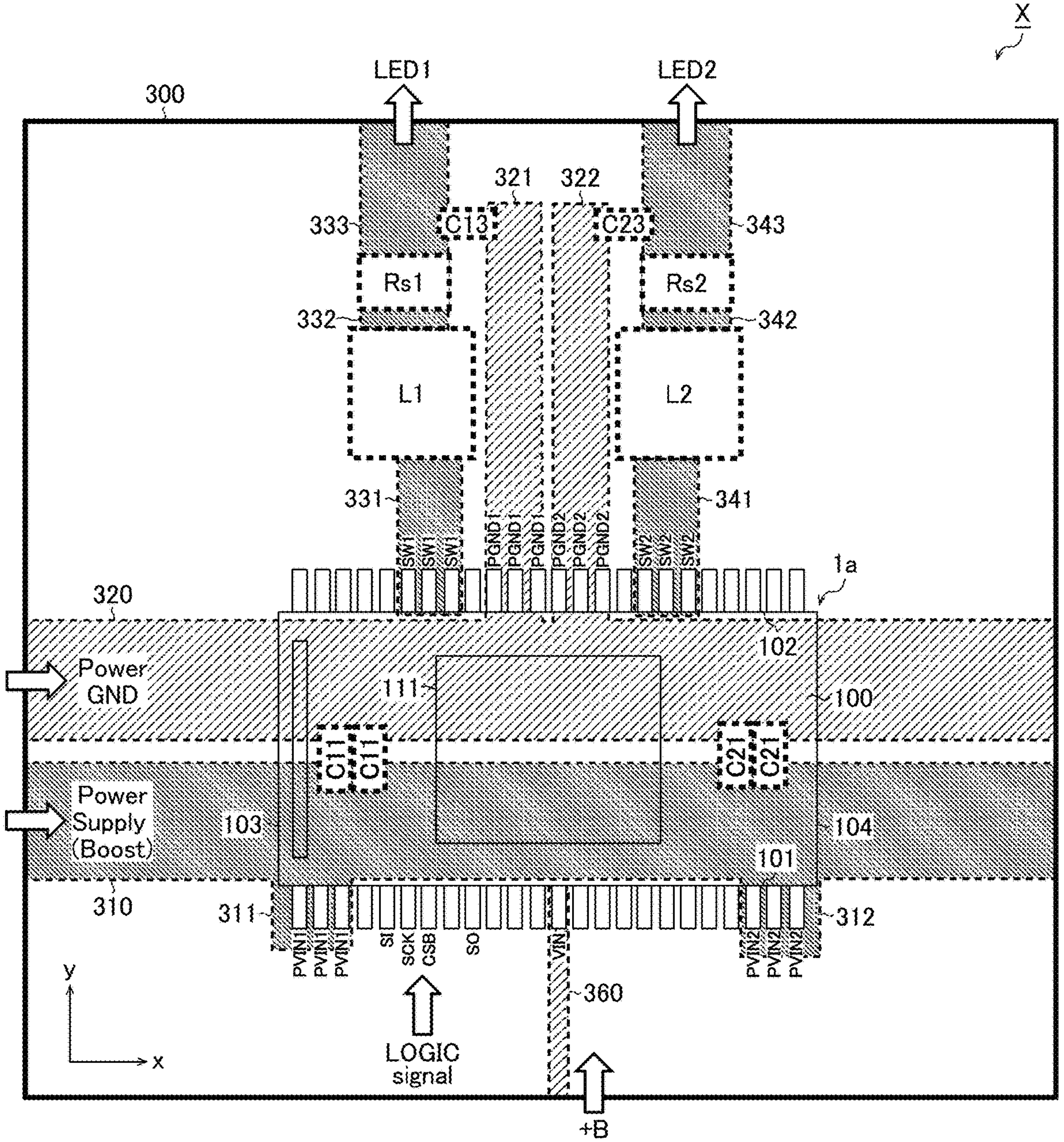
FIG. 14A is a diagram showing a PCB layout of an LED driver IC (2*ch*) adopting a synchronous rectification method.

FIG. 14A is a plan view showing a layout of a printed circuit board on which the LED driver IC 1*a* (2*ch*) shown in FIG. 10A is mounted. The LED lamp module X of this configuration example includes: a printed circuit board 300 (hereinafter, referred to as PCB 300); a 2-channel LED driver IC 1*a*; various discrete components to be externally attached to the foregoing (exemplified in this figure only by above-described capacitors C11 and C21, capacitors C13 and C23, inductors L1 and L2, and sense resistors Rs1 and Rs2); and light-emitting diodes LED1 and LED2 (not shown). Further, although not explicitly shown in this figure, a heat sink 200 is attached to the heat radiation pad 111 of the LED driver IC 1*a*.

The LED driver IC 1*a* is mounted on a first main surface (top side of the drawing sheet) of the PCB 300 as shown by thin solid lines. More specifically, the LED driver IC 1*a* is mounted in such a state that FIG. 10 has been rotated counterclockwise by 90 degrees. That is, in this figure, a left-right direction of the drawing sheet corresponds to the above-mentioned x direction, and an up-down direction of the drawing sheet corresponds to the above-mentioned y direction. Therefore, the power supply terminals (PVIN1, PVIN2) provided on the first side 101 of the package 100 are led out downward as in the drawing sheet, and the power ground terminals (PGND1, PGND2) as well as the switch output terminals (SW1, SW2) provided on the second side 102 of the package 100 are led out upward as in the drawing sheet.

On the other hand, various interconnection lines (power supply lines 310 to 312, power ground lines 320 to 322, switch output lines 331 to 333 and 341 to 343, a power supply line 360) to be connected to the LED driver IC 1*a*, as well as various discrete components (capacitors C11 and C21, capacitors C13 and C23, inductors L1 and L2, sense resistors Rs1 and Rs2) are laid or mounted on the second main surface (back side of the drawing sheet) of the PCB 300 as shown by broken lines. Hereinbelow, descriptions will be given specifically and concretely.

Main trunk portion of the power supply line 310 connected to the power supply terminals (PVIN1, PVIN2) of the LED driver IC 1*a*, as well as main trunk portion of the power ground line 320 connected to the power ground terminals (PGND1, PGND2) of the LED driver IC 1*a*, are laid down in parallel along the x direction (left-right direction of the drawing sheet) as viewed in plan view of the PCB 300.

Further, the main trunk portions of the power supply line 310 and the power ground line 320 are laid down, respectively, so as to overlap with the package 100 of the LED driver IC 1*a* as viewed in plan view of the PCB 300.

In more detail, according to this figure, the main trunk portion of the power supply line 310 is linearly laid down in a route which extends from outside of the third side 103 to outside of the fourth side 104 through a vicinity of the first side 101 on the back surface of the package 100.

On the other hand, the main trunk portion of the power ground line 320 is linearly laid down in a route which extends from outside of the third side 103 to outside of the fourth side 104 through a vicinity of the second side 102 on the back surface of the package 100 while keeping a specified gap from the main trunk portion of the power supply line 310.

In addition, capacitors C11 and C21 (=bypass capacitors) are connected between the main trunk portion of the power supply line 310 and the main trunk portion of the power ground line 320. In particular, the capacitors C11 and C21 may appropriately be mounted so as to overlap with the LED driver IC 1*a* as in plan view of the PCB 300 as shown in this figure.

In the power supply line 310, branch line portions 311 and 312 each branched from its main trunk portion are formed. According to this figure, the branch line portions 311 and 312 are branched downward, as in the drawing sheet, from the main trunk portion of the power supply line 310, which passes through the back surface of the package 100, toward the power supply terminals (PVIN1, PVIN2), respectively. Thus, the branch line portions 311 and 312 are made electrically conductive with the power supply terminals (PVIN1, PVIN2) by the medium of via holes, through holes or the like (not shown) extending between the first main surface and the second main surface of the PCB 300.

Further, in the power ground line 320, branch line portions 321 and 322 each branched from its main trunk portion are formed. According to this figure, the branch line portions 321 and 322 are branched upward, as in the drawing sheet, from the main trunk portion of the power ground line 320, which passes through the back surface of the package 100, toward the power ground terminals (PGND1, PGND2), respectively. Thus, the branch line portions 321 and 322 are made electrically conductive with the power ground terminals (PGND1, PGND2) by the medium of via holes, through holes or the like (not shown) extending between the first main surface and the second main surface of the PCB 300. It is noted that the power ground lines 321, 322 may be shared. In the case where the power ground lines 321, 322 are shared, branch line portions branched from the main trunk portion of the power supply line 310 are formed into one line.

The switch output lines 331 to 333 that electrically conduct between the switch output terminals (SW1) and the light-emitting diode LED1 of the first channel are laid upward, as in the drawing sheet, from the back surface region of the switch output terminals (SW1). In addition, an inductor L1 is mounted between the switch output line 331 and the switch output line 332. Also, a sense resistor Rs1 is mounted between the switch output line 332 and the switch output line 333. A capacitor C13 is mounted between the switch output line 333 and the branch line portion 321 of the power ground line 320 extending to a position adjacent to the switch output line 333.

The switch output lines 341 to 343 that electrically conduct between the switch output terminals (SW2) and the light-emitting diode LED2 of the second channel are laid upward, as in the drawing sheet, from the back surface region of the switch output terminals (SW2). In addition, an inductor L2 is mounted between the switch output line 341 and the switch output line 342. Also, a sense resistor Rs2 is mounted between the switch output line 342 and the switch output line 343. A capacitor C23 is mounted between the switch output line 343 and the branch line portion 322 of the power ground line 320 extending to a position adjacent to the switch output line 343.

Further, in the LED lamp module X of this configuration example, the power supply terminals (PVIN1, PVIN2), the switch output terminals (SW1, SW2), the power ground terminals (PGND1, PGND2), these terminals being provided for each one of a plurality of channels, and discrete components externally attached to the foregoing (C11 and C21, C13 and C23, L1 and L2, Rs1 and Rs2), as well as the branch line portions 311 and 312 of the power supply line 310, the branch line portions 321 and 322 of the power ground line 320, and the switch output lines 331 to 333 and 341 to 343, are placed so as to be left-right symmetrical between the first channel and the second channel.

External terminals and interconnection lines other than the above-described ones will also be described briefly. A power supply line 360 laid downward, as in the drawing sheet, from the back surface region of the package 100 is connected to the VIN pin provided on the first side 101 of the package 100. Also, a logic signal is inputted from downside, as in the drawing sheet, to the SPI communication terminals (SI, SCK, CSB, SO) provided on the first side 101.

FIG. 14A described above is a plan view showing a layout of the printed circuit board on which the LED driver IC 1*a* (2*ch*) having a half-bridge output stage of the synchronous rectification method is mounted. On the other hand, a plan view showing a layout of the printed circuit board on which an LED driver IC 1*a* (2*ch*) adopting the diode rectification method instead of the synchronous rectification method is mounted is shown in FIG. 14B.

Figure 14B:
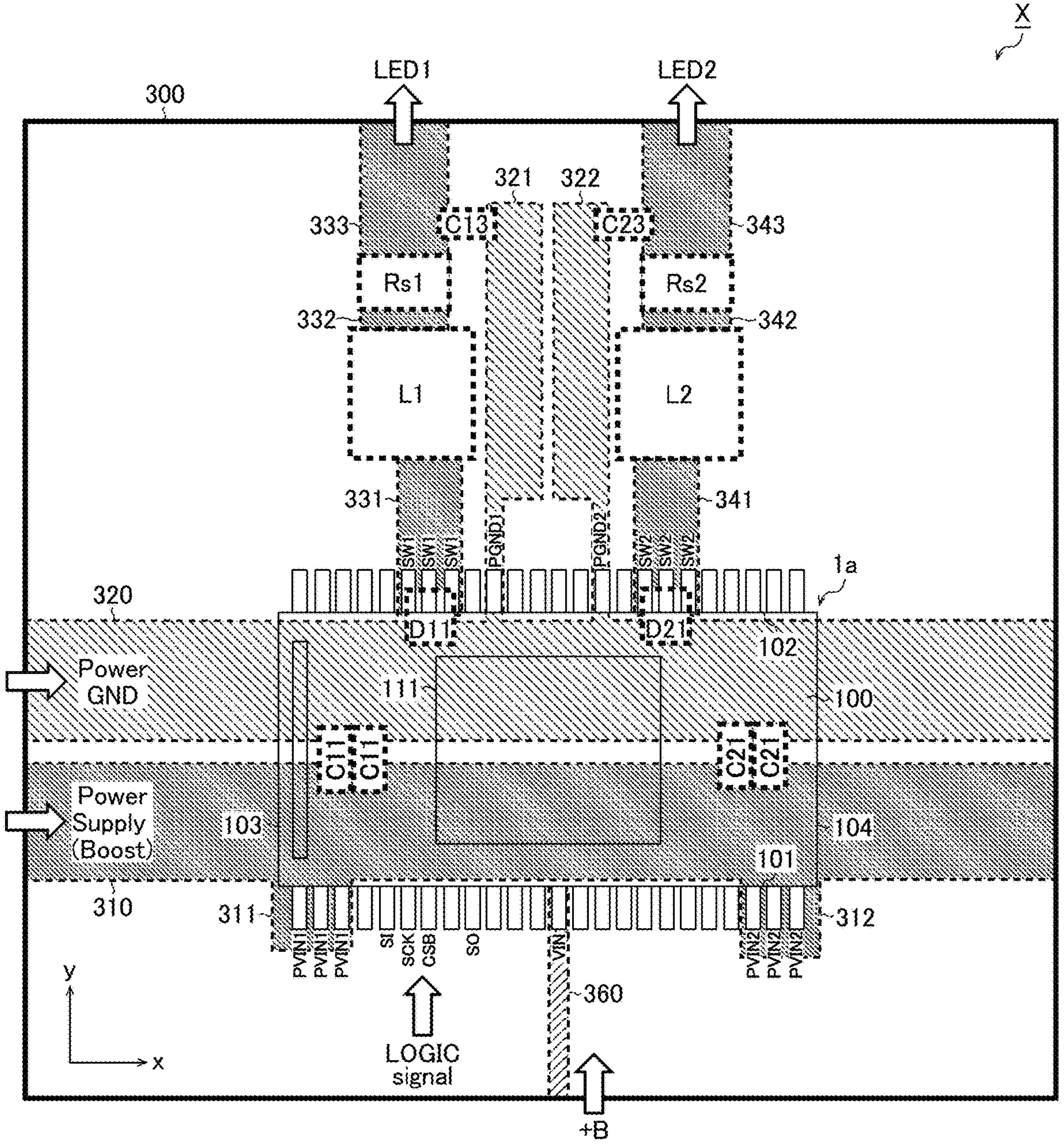
FIG. 14B is a diagram showing a PCB layout of an LED driver IC (2*ch*) adopting a diode rectification method.

Referring to FIG. 14B, its differences from FIG. 14A will be described. Diodes D11 and D21 are discrete components which are externally attached to the LED driver IC 1*a*. The diodes D11 and D21 are mounted on the second main surface of the PCB 300, as shown by broken lines. The diode D11 is used as the lower switch 11L of the first channel, and the diode D21 is used as the lower switch 11L of the second channel.

The diode D11 may appropriately be mounted so that a cathode-side terminal of the diode D11 electrically conducts with the switch output line 331 while an anode-side terminal of the diode D11 electrically conducts with the power ground line 320. In order to reduce the closed loop of the first channel (see FIG. 16 described later), it is preferable that the anode-side terminal of the diode D11 is placed as close as possible to the capacitor C11.

The diode D21 may appropriately be mounted so that a cathode-side terminal of the diode D21 electrically conducts with the switch output line 341 while an anode-side terminal of the diode D21 electrically conducts with the power ground line 320. In order to reduce the closed loop of the second channel (see FIG. 16 described later), it is preferable that the anode-side terminal of the diode D21 is placed as close as possible to the capacitor C21.

Figure 19:
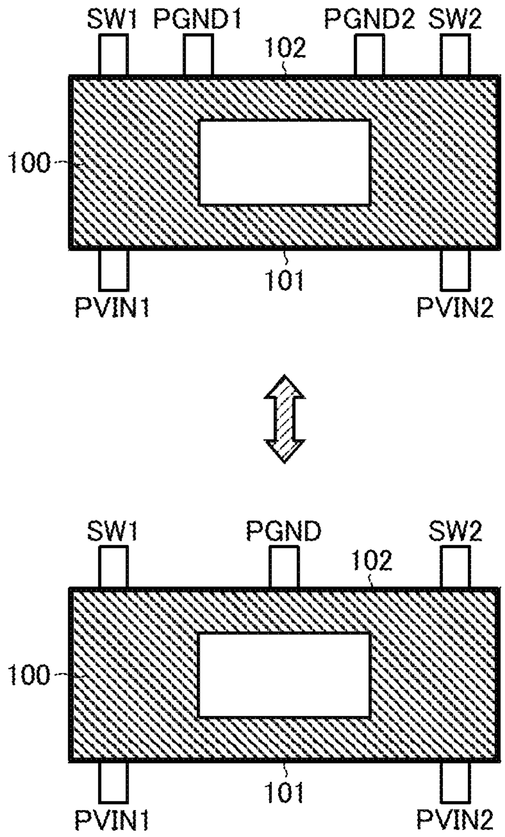
FIG. 19 is a diagram showing a first modification example of pin configuration.

In the configuration example shown in FIG. 14B, one power ground terminal PGND1 and one power ground terminal PGND2 are provided for the first channel and the second channel, respectively. However, as shown in FIG. 19 described later, one power ground terminal may be shared by the first channel and the second channel.

Figure 14C:
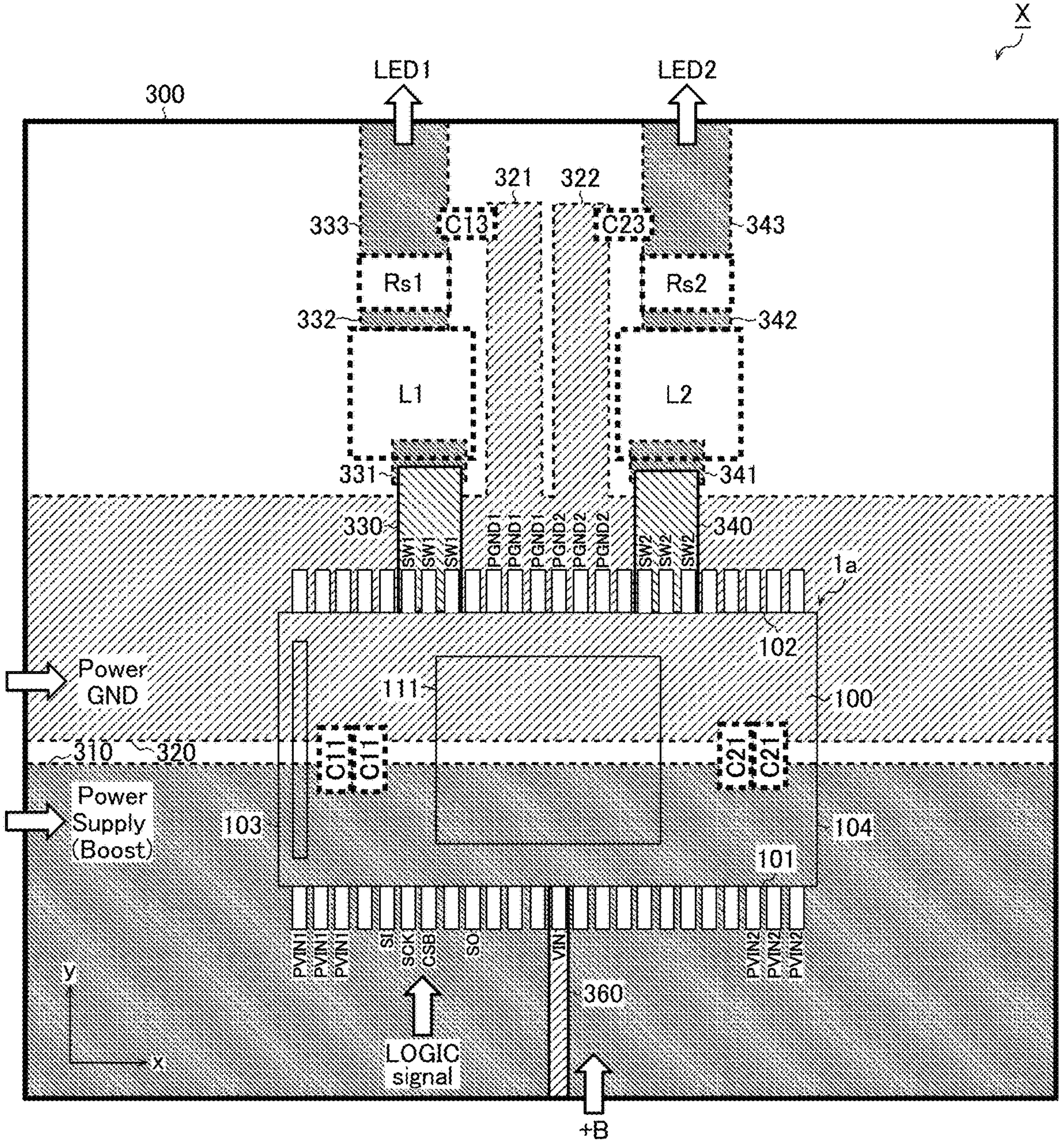
FIG. 14C is a diagram showing another PCB layout of an LED driver IC (2*ch*) adopting the synchronous rectification method.
Figure 14D:
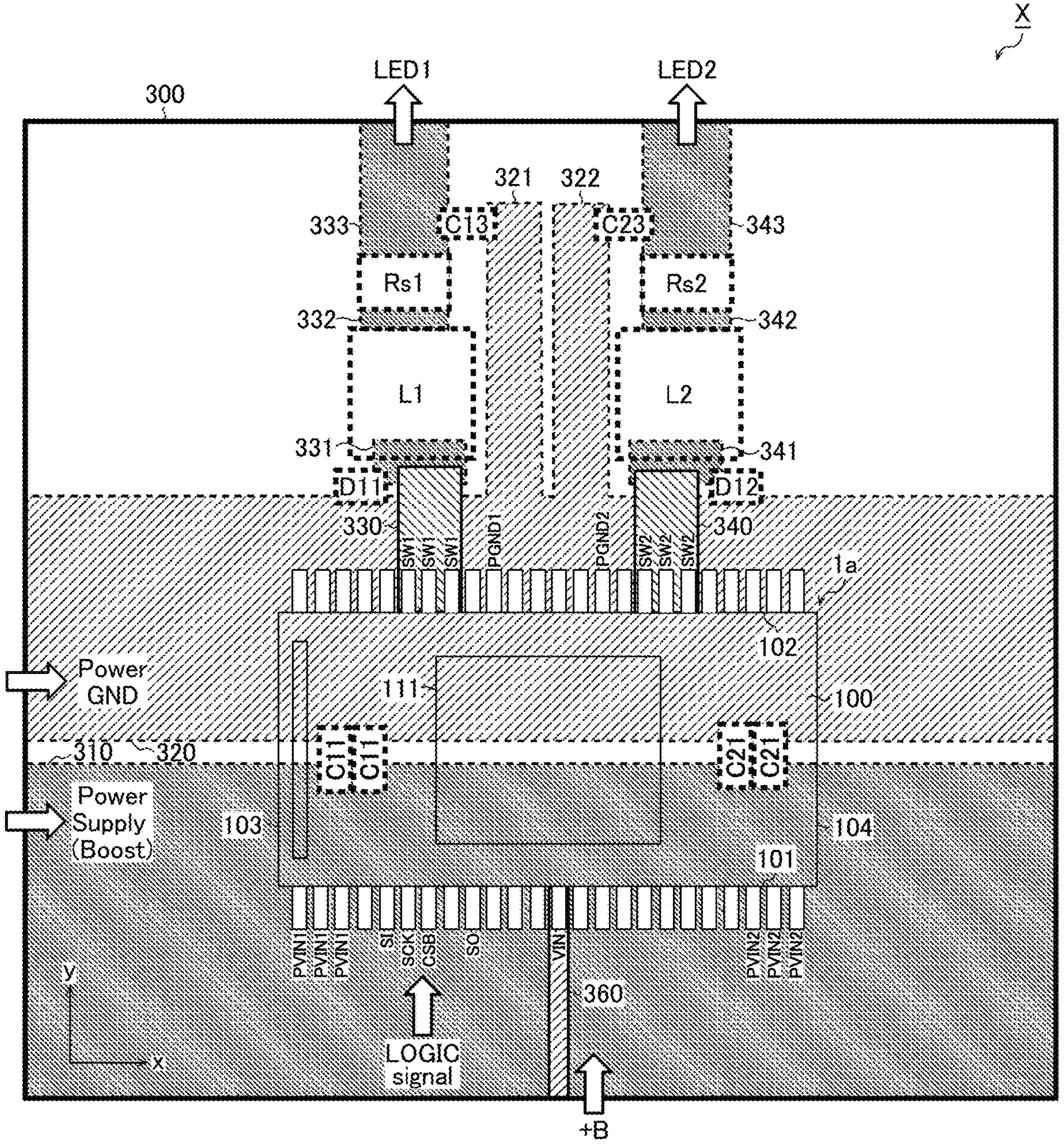
FIG. 14D is a diagram showing another PCB layout of an LED driver IC (2*ch*) adopting the diode rectification method.

Next, layouts of printed circuit boards other than the layouts shown in FIGS. 14A and 14B will be described. FIG. 14C is a plan view showing another layout of the printed circuit board on which the LED driver IC 1*a* (2*ch*) having the half-bridge output stage of the synchronous rectification system is mounted. FIG. 14D is a plan view showing another layout of the printed circuit board on which the LED driver IC 1*a* (2*ch*) having the half-bridge output stage of the diode rectification method is mounted. Hereinafter, differences from FIG. 14A in FIG. 14C as well as differences from FIG. 14B in FIG. 14D will be described.

In the layouts shown in FIGS. 14C and 14D, the power supply line 310 and the power ground line 320 are enlarged, as compared with the layouts shown in FIGS. 14A and 14B. Therefore, in the layouts shown in FIGS. 14C and 14D, the power supply line 360, a line for transmitting logic signals (not shown), the switch output line 330, and the switch output line 340 are laid down on the first main surface of the PCB 300, unlike the layouts shown in FIGS. 14A and 14B.

The switch output line 330 electrically conducts between the switch output terminals (SW1) and the switch output line 331 of the first channel. The switch output line 330 is made electrically conductive with the switch output line 331 by the medium of via holes, through holes or the like (not shown) extending between the first main surface and the second main surface of the PCB 300. In the layouts shown in FIGS. 14C and 14D, the switch output line 331 does not overlap with the switch output terminals (SW1), as in plan view of the PCB 300, unlike the layouts shown in FIGS. 14A and 14B.

The switch output line 340 electrically conducts between the switch output terminals (SW2) and the switch output line 341 of the second channel. The switch output line 340 is made electrically conductive with the switch output line 341 by the medium of via holes, through holes or the like (not shown) extending between the first main surface and the second main surface of the PCB 300. In the layouts shown in FIGS. 14C and 14D, the switch output line 341 does not overlap with the switch output terminals (SW2) as in plan view of the PCB 300, unlike the layouts shown in FIGS. 14A and 14B.

Figure 15:
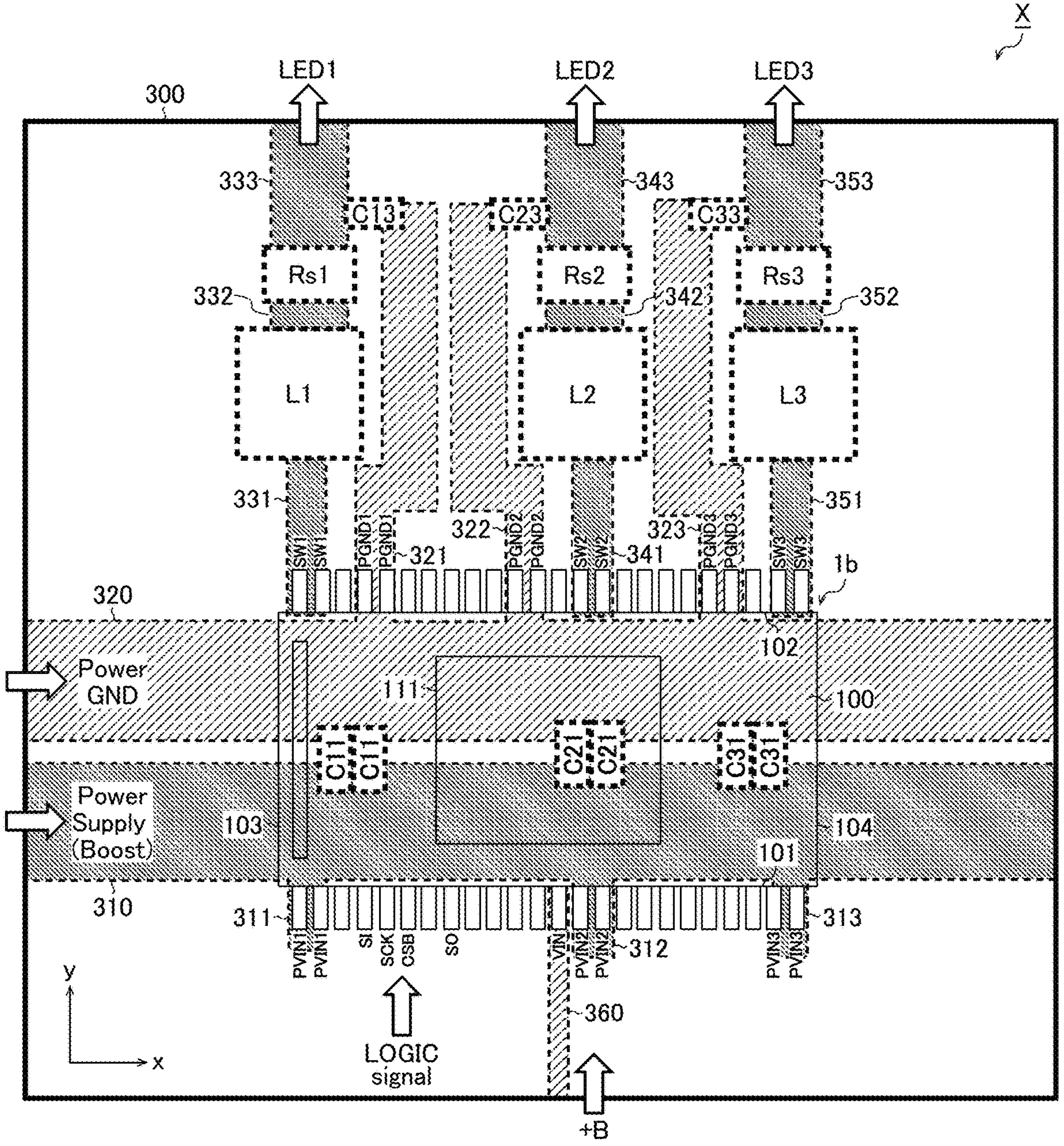
FIG. 15 is a diagram showing a PCB layout of an LED driver IC (3*ch*)

FIG. 15 is a plan view showing a layout of the printed circuit board on which the LED driver IC 1*b* (3*ch*) shown in FIG. 11A is mounted. The LED lamp module X of this configuration example includes a PCB 300, a 3-channel LED driver IC 1*b*, and various discrete components externally attached to the foregoing (in this figure, only above-mentioned capacitors C11, C21 and C31, capacitors C13, C23 and C33, inductors L1 to L3, and sense resistors Rs1 to Rs3 are illustrated), and light-emitting diodes LED1 to LED3 (not shown). Further, although not explicitly shown in this figure, a heat sink 200 is attached to the heat radiation pad 111 of the LED driver IC 1*b*.

The LED driver IC 1*b* is mounted on the first main surface (top side of the drawing sheet) of the PCB 300 as shown by thin solid lines. More specifically, the LED driver IC 1*b* is mounted in such a state that FIG. 11 has been rotated counterclockwise by 90 degrees. That is, in this figure, a left-right direction of the drawing sheet corresponds to the above-mentioned x direction, and an up-down direction of the drawing sheet corresponds to the above-mentioned y direction. Therefore, the power supply terminals (PVIN1 to PVIN3) provided on the first side 101 of the package 100 are led out downward as in the drawing sheet, and the power ground terminals (PGND1 to PGND3) as well as the switch output terminals (SW1 to SW3) provided on the second side 102 of the package 100 are led out upward as in the drawing sheet.

On the other hand, various interconnection lines (power supply lines 310 to 312, power ground lines 320 to 323, switch output lines 331 to 333 and 341 to 343 and 351 to 353, a power supply line 360) to be connected to the LED driver IC 1*b*, as well as various discrete components (capacitors C11, C21 and C31, capacitors C13, C23 and C33, inductors L1 to L3, and sense resistors Rs1 to Rs3) are laid or mounted on the second main surface (back side of the drawing sheet) of the PCB 300 as shown by broken lines. Hereinbelow, descriptions will be given specifically and concretely.

Main trunk portion of the power supply line 310 connected to the power supply terminals (PVIN1 to PVIN3) of the LED driver IC 1*b*, as well as main trunk portion of the power ground line 320 connected to the power ground terminals (PGND1 to PGND3) of the LED driver IC 1*b*, are laid down in parallel along the x direction (left-right direction of the drawing sheet) as viewed in plan view of the PCB 300.

Further, the main trunk portions of the power supply line 310 and the power ground line 320 are laid, respectively, so as to overlap with the package 100 of the LED driver IC 1*b* as viewed in plan view of the PCB 300.

In more detail, according to this figure, the main trunk portion of the power supply line 310 is linearly laid down in a route which extends from outside of the third side 103 to outside of the fourth side 104 through a vicinity of the first side 101 on the back surface of the package 100.

On the other hand, the main trunk portion of the power ground line 320 is linearly laid down in a route which extends from outside of the third side 103 to outside of the fourth side 104 through a vicinity of the second side 102 on the back surface of the package 100 while keeping a specified gap from the main trunk portion of the power supply line 310.

In addition, capacitors C11, C21 and C31 (=bypass capacitors) are connected between the main trunk portion of the power supply line 310 and the main trunk portion of the power ground line 320. In particular, the capacitors C11, C21 and C31 may appropriately be mounted so as to overlap with the LED driver IC 1*b* as in plan view of the PCB 300 as shown in this figure.

In the power supply line 310, branch line portions 311 to 313 each branched from its main trunk portion are formed. According to this figure, the branch line portions 311 to 313 are branched downward, as in the drawing sheet, from the main trunk portion of the power supply line 310 passing through the back surface of the package 100 toward the power supply terminals (PVIN1 to PVIN3), respectively. Thus, the branch line portions 311 to 313 are made electrically conductive with the power supply terminals (PVIN1 to PVIN3) by the medium of via holes, through holes or the like (not shown) extending between the first main surface and the second main surface of the PCB 300.

Further, in the power ground line 320, branch line portions 321 to 323 each branched from its main trunk portion are formed. According to this figure, the branch line portions 321 to 323 are branched upward, as in the drawing sheet, from the main trunk portion of the power ground line 320, which passes through the back surface of the package 100, toward the power ground terminals (PGND1 to PGND3), respectively. Thus, the branch line portions 321 to 323 are made electrically conductive with the power ground terminals (PGND1 to PGND3) by the medium of via holes, through holes or the like (not shown) extending between the first main surface and the second main surface of the PCB 300.

The switch output lines 331 to 333 that electrically conduct between the switch output terminals (SW1) and the light-emitting diode LED1 of the first channel are laid upward, as in the drawing sheet, from the back surface region of the switch output terminals (SW1). In addition, an inductor L1 is mounted between the switch output line 331 and the switch output line 332. Also, a sense resistor Rs1 is mounted between the switch output line 332 and the switch output line 333. A capacitor C13 is mounted between the switch output line 333 and the branch line portion 321 of the power ground line 320 extending to a position adjacent to the switch output line 333.

The switch output lines 341 to 343 that electrically conduct between the switch output terminals (SW2) and the light-emitting diode LED2 of the second channel are laid upward, as in the drawing sheet, from the back surface region of the switch output terminals (SW2). In addition, an inductor L2 is mounted between the switch output line 341 and the switch output line 342. Also, a sense resistor Rs2 is mounted between the switch output line 342 and the switch output line 343. A capacitor C23 is mounted between the switch output line 343 and the branch line portion 322 of the power ground line 320 extending to a position adjacent to the switch output line 343.

The switch output lines 351 to 353 that electrically conduct between the switch output terminals (SW3) and the light-emitting diode LED3 of the third channel are laid upward, as in the drawing sheet, from the back surface region of the switch output terminals (SW3). In addition, an inductor L3 is mounted between the switch output line 351 and the switch output line 352. Also, a sense resistor Rs3 is mounted between the switch output line 352 and the switch output line 353. A capacitor C33 is mounted between the switch output line 353 and the branch line portion 323 of the power ground line 320 extending to a position adjacent to the switch output line 353.

Further, in the LED lamp module X of this configuration example, the power supply terminals (PVIN1 to PVIN3), the switch output terminals (SW1 to SW3), the power ground terminals (PGND1 to PGND3), these terminals being provided for each one of a plurality of channels, and discrete components externally attached to the foregoing (C11, C21 and C31; C13, C23 and C33; L1 to L3; and Rs1 to Rs3), as well as the branch line portions 311 to 313 of the power supply line 310, the branch line portions 321 to 323 of the power ground line 320, and the switch output lines 331 to 333, 341 to 343 and 351 to 353, are placed so as to be left-right symmetrical between at least two channels. More specifically, the above-described members are placed so that their component elements become left-right symmetrical between the first channel and the second channel as well as between the first channel and the third channel.

External terminals and interconnection lines other than the above-described ones will also be described briefly. A power supply line 360 laid downward, as in the drawing sheet, from the back surface region of the package 100 is connected to the VIN pin provided on the first side 101 of the package 100. Also, a logic signal is inputted from downside, as in the drawing sheet, to the SPI communication terminals (SI, SCK, CSB, SO) provided on the first side 101.

It is noted that modifications similar to those from above-described FIG. 14A to above-described FIGS. 14B to 14D may also be carried out also for FIG. 15.

<Bypass Capacitor>

Figure 16:
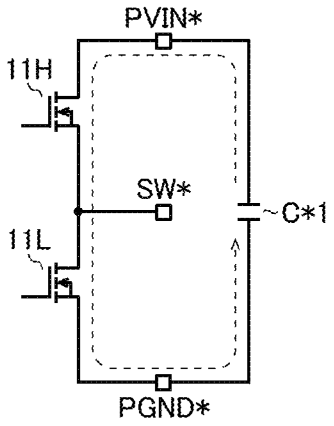
FIG. 16 is a diagram showing closed loop formation of a bypass capacitor.

Next, an optimum placement layout for a capacitor C*1 (where *=1, 2 or 3) that functions as a bypass capacitor will be discussed with reference to the accompanying drawings. FIG. 16 is a diagram showing closed loop formation of a capacitor C*1.

As shown in this figure, the capacitor C*1 of a *-th channel cooperates with the upper switch 11H and the lower switch 11L to form a closed loop (11H→PVIN*→C*1→PGND*→11L). The smaller the closed loop becomes, the more the effects of transient currents due to power supply variations can be reduced. Therefore, it is desirable that the capacitor C*1 is mounted at a position where the above-described closed loop is minimized.

More specifically, as shown in FIGS. 14A to 14D and FIG. 15 described above, the capacitor C*1 is desirably mounted so as to overlap with the LED driver IC 1*a* or IC 1*b*, as in plan view of the PCB 300 and, more preferably, mounted on (or near) a line segment interconnecting a PVIN* pin and a PGND* pin.

<Vertical Placement of LED Driver ICs>

Figure 17:
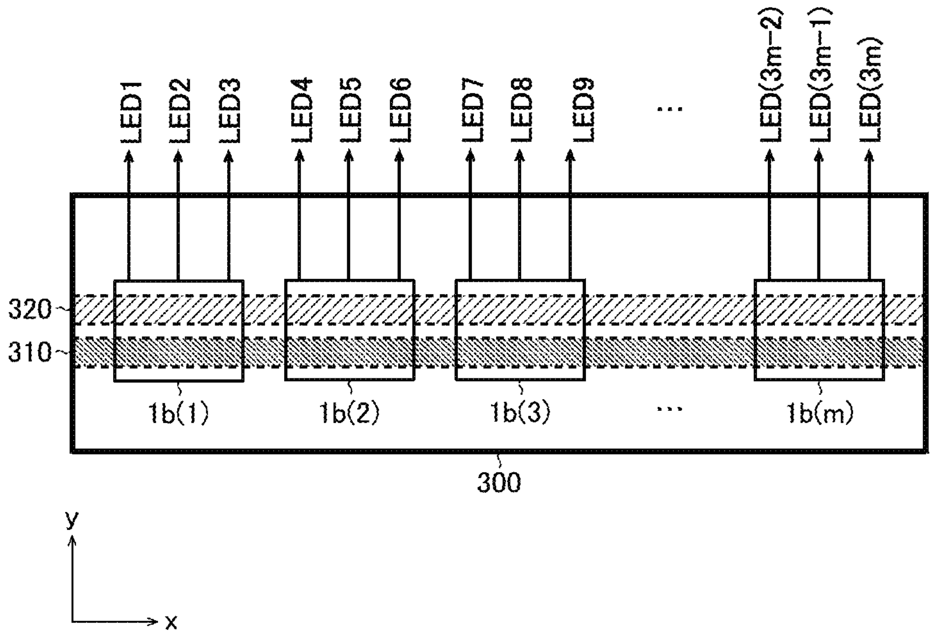
FIG. 17 is a diagram showing a vertical-line placement of an LED driver IC (3*ch*)

FIG. 17 is a diagram showing a vertical placement of LED driver ICs 1*b* (3*ch*). In the LED lamp module X of this configuration example, m LED driver ICs 1*b* (1) to 1*b*(*m*) (where m≥2) are mounted in vertical line along the x direction (left-right direction of the drawing sheet) on the first main surface of the PCB 300.

In each of the LED driver ICs 1*b* (1) to 1*b*(*m*), the pin configuration shown in FIG. 11 described above is adopted. Therefore, as shown in FIG. 15 described above, the power supply line 310 and the power ground line 320 can be laid down in a straight line along the x direction (left-right direction of the drawing sheet) so as to pass through the back surfaces of the LED driver ICs 1*b* (1) to 1*b*(*m*).

Also, since all the switch output lines of the LED driver ICs 1*b* (1) to 1*b*(*m*), respectively, can be led out upward as in the drawing sheet, it becomes possible to array the light-emitting diodes LED1 to LED (3m) of all the channels along the x direction (left-right direction as in the drawing sheet) even with the number of channels increased.

Thus, adopting the above-described pin configuration makes it possible to simplify interconnection patterns laid on the PCB 300. As a consequence, it also becomes possible to fulfill optimization of the PCB layout in terms of prevention from short-circuiting between interconnection patterns as well as reduction in interconnection-pattern area.

In addition, although the vertical placement of the LED driver IC 1*b* (3*ch*) is described as an example in this figure, the above description is applicable also to the vertical placement of the LED driver IC 1*a* (2*ch*).

Comparative Example

Next, for clearer understanding of functional effects of the pin configurations (FIGS. 10 to 15) described hereinabove, differences among PCB layouts will be explained below by taking a comparative example in which a pin configuration other than the foregoing ones is adopted.

Figure 18:
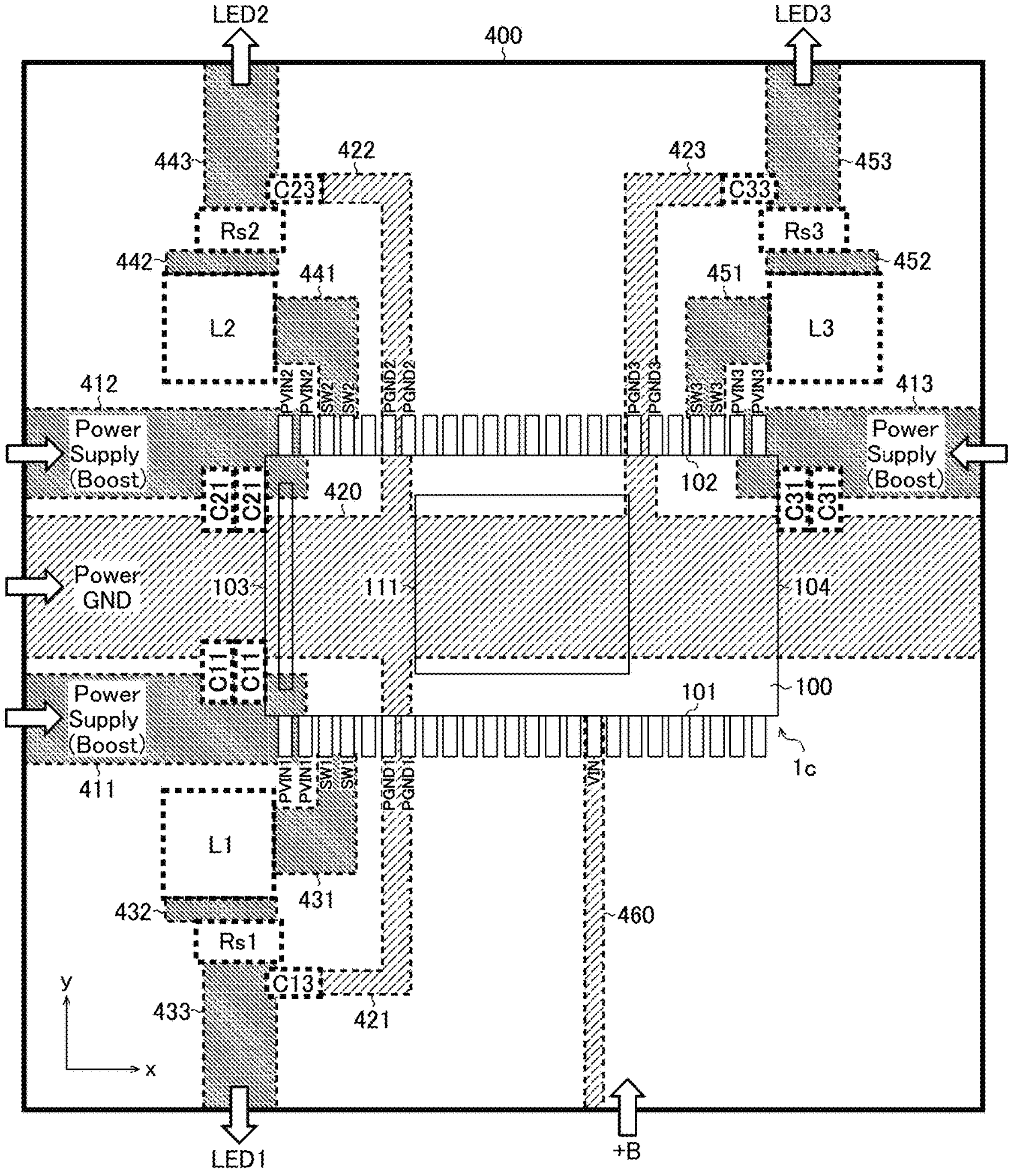
FIG. 18 is a diagram showing a PCB layout (comparative example) of an LED driver IC (3*ch*)

FIG. 18 is a plan view showing a layout of a printed circuit board on which an LED driver IC 1*c* (3*ch*) adopting a pin configuration different from the foregoing ones is mounted.

As shown in this figure, in the LED driver IC 1*c*, external terminals (PVIN1, PGND1, SW1) of the first channel are intensively placed on the first side 101 of the package 100. On the other hand, external terminals (PVIN2, PGND2, SW2) of the second channel as well as external terminals (PVIN3, PGND3, SW3) of the third channel are intensively placed, respectively, on the second side 102 of the package 100.

Accordingly, component elements of the first channel as well as component elements of the second channel and the third channel are inevitably laid down or placed in separation to both sides of the LED driver IC 1*c*.

According to this figure, the component elements of the first channel (power supply line 411, branch line portion 421 of power ground line 420, switch output lines 431 to 433, capacitors C11 and C13, inductor L1, and sense resistor Rs1) are all placed on or near the first side 101 of the package 100.

On the other hand, the component elements of the second channel (power supply line 412, branch line portion 422 of power ground line 420, switch output lines 441 to 443, capacitors C21 and C23, inductor L2, and sense resistor Rs2) are all placed on or near the second side 102 of the package 100.

Further, the component elements of the third channel (power supply line 413, branch line portion 423 of power ground line 420, switch output lines 451 to 453, capacitors C31 and C33, inductor L3, and sense resistor Rs3) are all placed on or near the second side 102 of the package 100.

Thus, with the pin configuration of this comparative example adopted, interconnection patterns to be laid down on the PCB 400 would be quite complicated, and moreover it becomes impossible to place the light-emitting diodes LED1 to LED3 of all the channels along the x direction (left-right direction as in the drawing sheet).

On the other hand, with the pin configurations proposed hereinabove (FIGS. 10 to 15) adopted, it becomes possible to optimize the PCB layout by avoiding such disadvantages as described above.

Modification Examples

The pin configurations and the PCB layouts described hereinabove may be modified in various ways. A brief description will be given below by taking some modification examples.

FIG. 19 is a diagram showing a first modification example of pin configuration. As shown in this figure, the power ground terminal (PGND) does not necessarily need to be provided for each of a plurality of channels, and may be shared by a plurality of channels.

Figure 20:
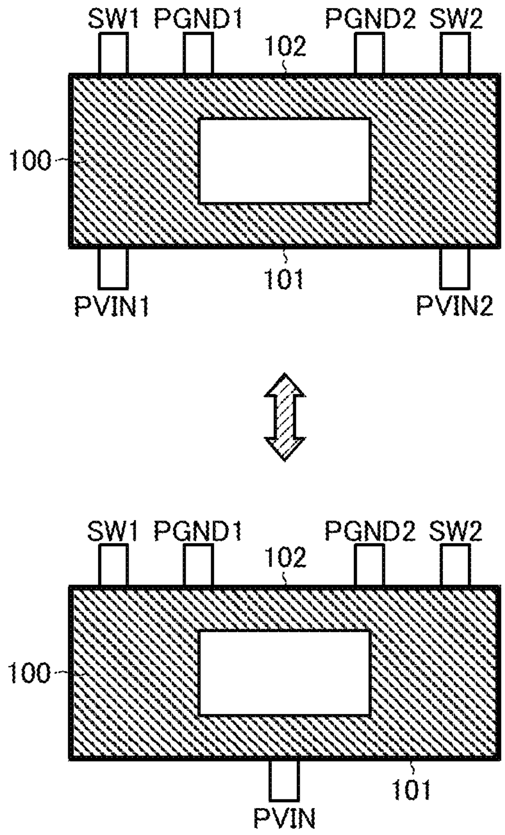
FIG. 20 is a diagram showing a second modification example of pin configuration.

FIG. 20 is a diagram showing a second modification example of pin configuration. As shown in this figure, the power supply terminal (PVIN) does not necessarily need to be provided for each of a plurality of channels, and may be shared by a plurality of channels.

Figure 21:
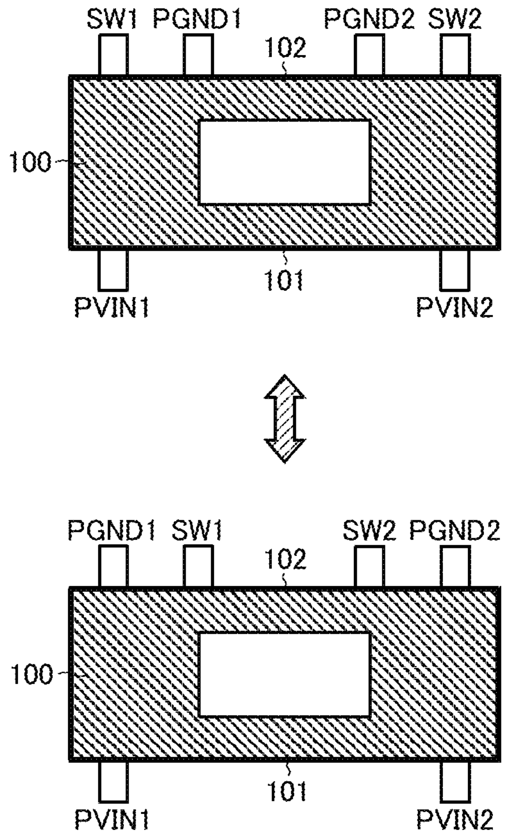
FIG. 21 is a diagram showing a third modification example of pin configuration.

FIG. 21 is a third modification example of pin configuration. As shown in this figure, power ground terminals (PGND) and switch output terminals (SW) that are to be provided on the second side 102 may be interchanged in position with one another.

Figure 22:
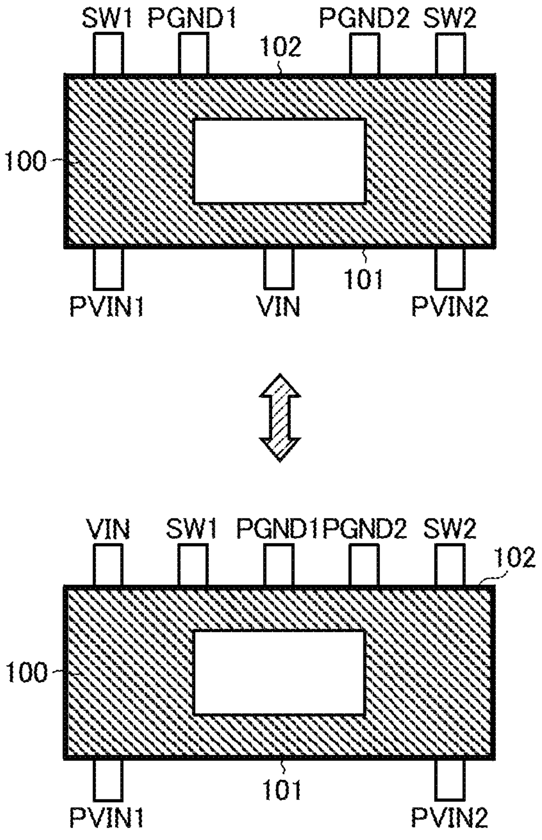
FIG. 22 is a diagram showing a fourth modification example of pin configuration.

FIG. 22 is a diagram showing a fourth modification example of pin configuration. As shown in this figure, the power supply terminal (VIN) of the signal system does not necessarily need to be provided on the first side 101, and may be provided on the second side 102.

Figure 23:
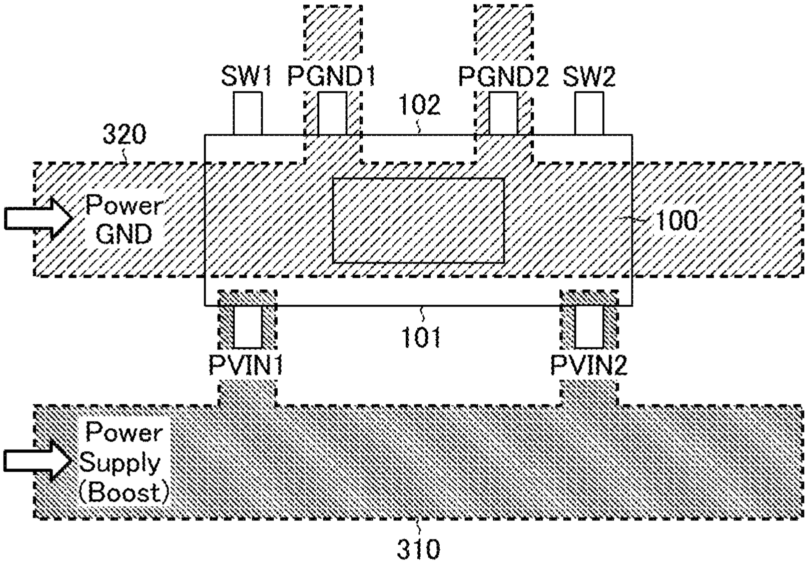
FIG. 23 is a diagram showing a modification example of PCB layout.

FIG. 23 is a diagram showing a modification example of PCB layout. As shown in this figure, at least one of the power supply line 310 and the power ground line 320 (power supply line 310 in this figure) may be laid at such a position as to be kept from overlapping with the package 100.

Figure 24:
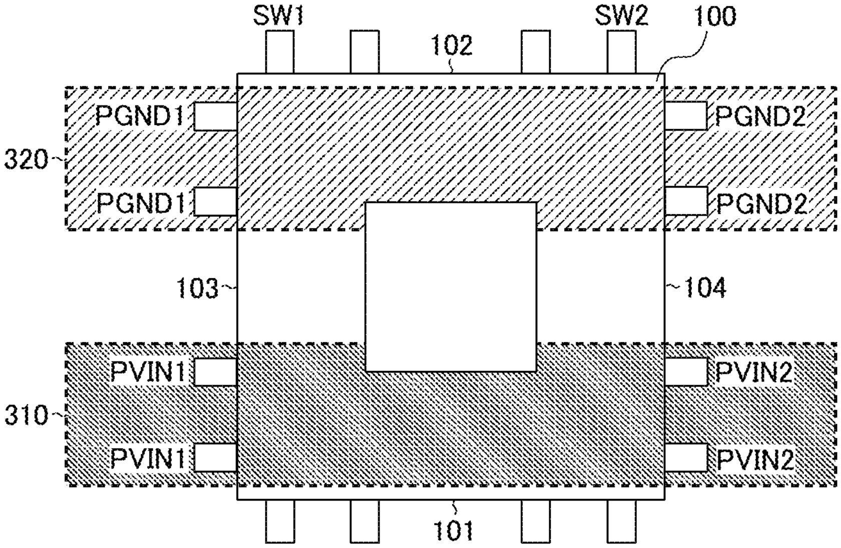
FIG. 24 is a diagram showing an example of adoption of a QFP.

FIG. 24 is a diagram showing an example of adoption of a QFP (quad flat package). As shown in this figure, the package 100 is not necessarily limited to an SOP, and a QFP may be adopted.

In such a case, for example, it is appropriate that the SW1 pin and the SW2 pin are placed on the second side 102, the PVIN1 pins and the PGND1 pins of the first channel are placed on the third side 103, and the PVIN2 pins and the PGND2 pins of the second channel are placed on the fourth side 104. Also, it is appropriate that the PVIN1 pins and the PVIN2 pins are placed closer to the first side 101, and the PGND1 pins and the PGND2 pins are placed closer to the second side 102. Further, it is appropriate that the PVIN1 pins and the PVIN2 pins are placed at positions opposed to each other. Similarly, it is appropriate that the PGND1 pins and the PGND2 pins are placed at positions opposed to each other.

By adopting such a pin configuration, it becomes possible to lay down the power supply line 310 and the power ground line 320 in parallel and in a straight line as in the case of foregoing FIG. 14A.

<Coplanar Mounting>

Figure 25:
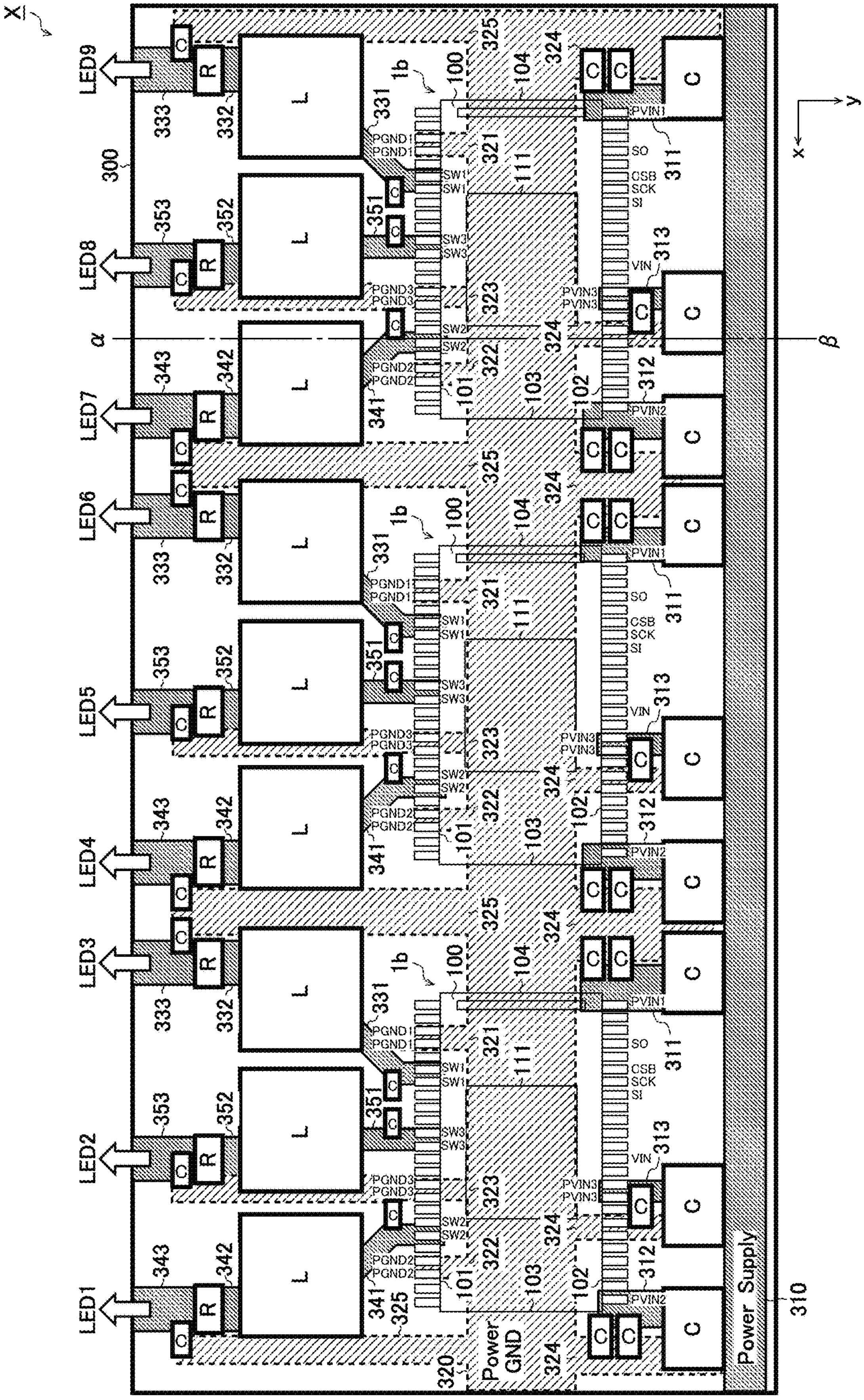
FIG. 25 is a diagram showing a PCB layout in which LED driver ICs (3*ch*) and discrete components are mounted coplanarly on one surface.

FIG. 25 is a plan view showing a layout of a printed circuit board on which the LED driver ICs 1*b* (3*ch*) shown in FIG. 11B and a plurality of discrete components externally attached to the LED driver ICs 1*b* (3*ch*) are mounted coplanarly on one surface. The LED lamp module X of this configuration example includes a PCB 300, 3-channel LED driver ICs 1*b* (three ICs in this figure) shown in FIG. 11B, various discrete components externally attached to these foregoing elements (in this figure, capacitors C, inductors L and sense resistors R are illustrated), and light-emitting diodes LED1 to LED9 (not shown). Further, although not explicitly shown in this figure, a heat sink 200 is attached to the heat radiation pad 111 of each LED driver IC 1*b*.

The LED driver ICs 11*b* are mounted on a first main surface (top side of the drawing sheet) of the PCB 300 as shown by thin solid lines. Also, at least part of various interconnections and various discrete components connected to the LED driver ICs 1*b* are laid or mounted on the first main surface (top side of the drawing sheet) of the PCB 300 as shown by solid lines. The rest of the components are laid or mounted on the second main surface (back side of the drawing sheet) of the PCB 300 as shown by broken lines. A specific, concrete description will be given below.

The main trunk portion of the power supply line 310 connected to the power supply terminals (PVIN1 to PVIN3) of the LED driver ICs 1*b* is laid down along the x direction at such a position in the first main surface of the PCB 300 as to be kept from overlapping with the packages 100 of the LED driver ICs 1*b*.

On the other hand, the main trunk portion of the power ground line 320 connected to the power ground terminals (PGND1 to PGND3) of the LED driver ICs 1*b* is laid down along the x direction at such a position in the second main surface of the PCB 300 as to overlap with the packages 100 of the LED driver ICs 1*b*.

In the power supply line 310, branch line portions 311 to 313 each branched from its main trunk portion are formed. According to this figure, the branch line portions 311 to 313 are branched from the main trunk portion of the power supply line 310 toward the power supply terminals (PVIN1 to PVIN3) in the first main surface of the PCB 300, respectively. Thus, the branch line portions 311 to 313 are made electrically conductive with the power supply terminals (PVIN1 to PVIN3).

Further, in the power ground line 320, branch line portions 321 to 325 each branched from its main trunk portion are formed. According to this figure, the branch line portions 321 to 323 are branched from the main trunk portion of the power ground line 320 toward the power ground terminals (PGND1 to PGND3), respectively, in the second main surface of the PCB 300. Thus, the branch line portions 321 to 323 are made electrically conductive with the power ground terminals (PGND1 to PGND3) by the medium of via holes, through holes or the like (not shown) extending between the first main surface and the second main surface of the PCB 300.

Also, in the second main surface of the PCB 300, the branch line portion 324 is branched from the main trunk portion of the power ground line 320 toward the branch line portions 311 to 313 of the power supply line 310. In addition, bypass capacitors C are mounted between the branch line portions 311 to 313 of the power supply line 310 and the branch line portion 324 of the power ground line 320.

On the other hand, the branch line portion 325 is branched, in the second main surface of the PCB 300, from the main trunk portion of the power ground line 320 toward later-described switch output lines 333 to 353.

The switch output lines 331 to 333 connected to the switch output terminals (SW1) of each LED driver IC 1*b* are laid toward the corresponding light-emitting diodes (LED3, LED6 and LED9 in this figure) on the first main surface of the PCB 300. In addition, an inductor L is mounted on the first main surface of the PCB 300 between the switch output line 331 and the switch output line 332. Further, a sense resistor R is mounted on the first main surface of the PCB 300 between the switch output line 332 and the switch output line 333. An output capacitor C is mounted on the first main surface of the PCB 300 between the switch output line 333 and the branch line portion 325 of the power ground line 320 extending to a position adjacent to the switch output line 333.

The switch output lines 341 to 343 connected to the switch output terminals (SW2) of each LED driver IC 1*b* are laid toward the corresponding light-emitting diodes (LED1, LED4 and LED7 in this figure) on the first main surface of the PCB 300. In addition, an inductor L is mounted on the first main surface of the PCB 300 between the switch output line 341 and the switch output line 342. Further, a sense resistor R is mounted on the first main surface of the PCB 300 between the switch output line 342 and the switch output line 343. An output capacitor C is mounted on the first main surface of the PCB 300 between the switch output line 343 and the branch line portion 325 of the power ground line 320 extending to a position adjacent to the switch output line 343.

The switch output lines 351 to 353 connected to the switch output terminals (SW3) of each LED driver IC *b* are laid toward the corresponding light-emitting diodes (LED2, LED5 and LED8 in this figure) on the first main surface of the PCB 300. In addition, an inductor L is mounted on the first main surface of the PCB 300 between the switch output line 351 and the switch output line 352. A sense resistor R is mounted on the first main surface of the PCB 300 between the switch output line 352 and the switch output line 353. Further, an output capacitor C is mounted on the first main surface of the PCB 300 between the switch output line 353 and the branch line portion 323 of the power ground line 320 extending to a position adjacent to the switch output line 353.

Although not explicitly shown in this figure, discrete components of a small signal system may appropriately be mounted on the second main surface of the PCB 300.

Further, in coplanarly mounting the LED driver ICs and discrete components externally attached to the LED driver ICs on one surface of a printed wiring board, the number of channels and the pin configuration of the LED driver ICs are not limited. That is, in this figure, not only the LED driver IC 1*b* (3*ch*) shown in FIG. 11B, but also the LED driver IC 1*b* (3*ch*) shown in FIG. 11A as well as the LED driver ICs 1*a* (2*ch*) shown in FIGS. 10A and 10B may be mounted in the form of coplanar one-surface mounting with discrete components.

Figure 26:
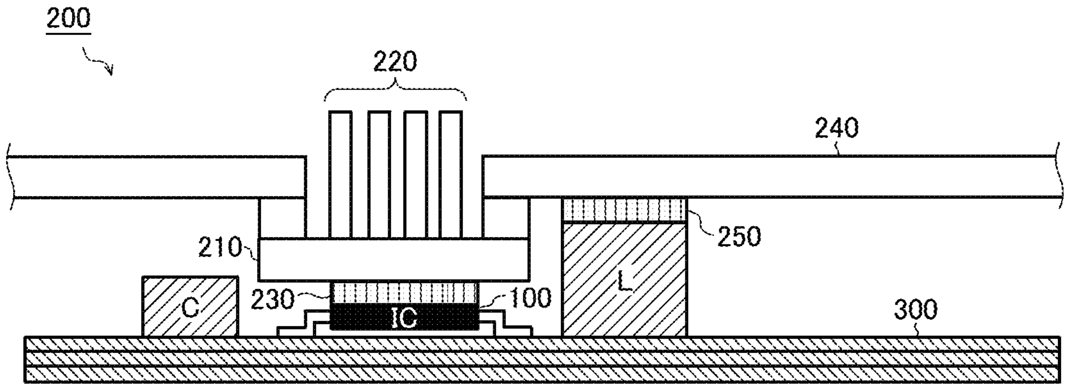
FIG. 26 is a diagram showing an α-β cross section of FIG. 25.

FIG. 26 is a diagram showing an α-β cross section of FIG. 25. As described above, in the LED lamp module X of FIG. 25, the three LED driver ICs 1*b* and at least part of the discrete components (inductor L, sense resistor R, output capacitor C) externally attached to the LED driver ICs 1*b* are both mounted on the same surface (first main surface) of the PCB 300.

Therefore, by devising the shape of the heat sink 200 attached to the LED driver IC 1*b*, the heat sink 200 can be attached commonly to both the LED driver IC 1*b* and the discrete components (inductor L etc.) both mounted coplanarly on one surface of the PCB 300.

For example, as shown in this figure, it is desirable that an extending portion 240 extending from the base portion 210 of the heat sink 200 toward above the inductor L is provided, and the extending portion 240 with heat radiation grease 250 applied to its bottom surface may appropriately be stuck to a top surface of the inductor L. With such a configuration, it becomes possible to enhance the heat radiation of not only the LED driver ICs 1*b* but also the discrete components.

For example, as shown in this figure, arraying discrete components of equal height in one line makes it possible to facilitate shape design of the heat sink 200 (particularly extending portion 240). Further, although the LED driver IC 1*b* and the inductor L are joined together with the heat sink 200 in this figure, other discrete components may also be joined together with the heat sink 200 as required.

Other Modification Examples

As described above, in addition to the above-described embodiments, various technical features disclosed herein may be modified in various ways without departing from the gist of the technical creation. That is, the above-described embodiments should be considered as exemplificative, and not limitative, in all points. The technical scope of the present invention should not be limited to the above-described embodiments, and should be construed as including all changes and modifications equivalent in sense and range to the appended claims for patent.

INDUSTRIAL APPLICABILITY

The invention disclosed herein is applicable to, for example, multi-channel LED driver ICs which are mounted on on-vehicle LED lamp modules.

REFERENCE SIGNS LIST

1, 1*a*, 1*b* LED driver IC (semiconductor device)
2 booster circuit
3 MCU
11H upper switch (NMOSFET)
11L lower switch (NMOSFET)
12H upper driver
12L lower driver
13 controller
14 on-time setter
15 slope voltage generator
16 sense amplifier
17 error amplifier
18 comparator
100 package
101 first side
102 second side
103 third side
104 fourth side
110 top surface
111 heat radiation pad
112 1-pin mark
120 bottom surface
130 semiconductor chip
140 island
151, 152 support frame
200 heat sink
210 base portion
220 heat radiation fins
230 heat radiation grease
240 extending portion
250 heat radiation grease
300 printed circuit board
310 power supply line (main trunk portion)
311, 312, 313 power supply line (branch line portion)
320 power ground line (main trunk portion)
321, 322, 323, 324, 325 power ground line (branch line portion)
330 to 333, 340 to 343, 351 to 353 switch line
360 power supply line
C1, C2, C11 to C13, C21 to C23, C31 to C33 capacitor
D1, D11, D21 diode
L1, L2, L3 inductor
LED1, LED2, LED3 light-emitting diode
R1, R2 resistor
Rs1, Rs2, Rs3 sense resistor
W11 to W13, W21 to W23, W31 to W33 wire
X LED lamp module

The invention claimed is:

1. A semiconductor device comprising:

a package having a rectangular shape as viewed in plan and including a first side, a second side parallel to the first side, a third side orthogonal to the first side as well as the second side, and a fourth side parallel to the third side and orthogonal to the first side as well as the second side;

a power supply terminal provided either on the first side or on the second side;

a power ground terminal provided either on the first side or on the second side;

a switch output terminal provided on the second side;

an upper switch connected between the power supply terminal and the switch output terminal; and a lower switch connected between the switch output terminal and the power ground terminal, wherein the upper switch, the lower switch, the switch output terminal, the power supply terminal and the power ground terminal are provided for each one of the plurality of channels, respectively.

2. The semiconductor device according to claim 1, wherein the switch output terminals provided for each one of the plurality of channels are placed in symmetry between at least two channels.

3. The semiconductor device according to claim 1, wherein the power supply terminals provided for each one of the plurality of channels are placed in symmetry between at least two channels.

4. The semiconductor device according to claim 1, wherein the power ground terminals provided for each one of the plurality of channels are placed in symmetry between at least two channels.

5. The semiconductor device according to claim 1, wherein at least one of the power supply terminal and the power ground terminal is shared by the plurality of channels.

6. The semiconductor device according to claim 1, further comprising a heat radiation pad exposed on a top surface of the package.

7. The semiconductor device according to claim 1, wherein a thermal resistance over a range from a semiconductor chip sealed in the package to the top surface is smaller than a thermal resistance over a range from the semiconductor chip to a bottom surface of the package.

8. The semiconductor device according to claim 1, wherein the upper switch and the lower switch are placed such unevenly as to be closer to the second side, as viewed in plan view.

9. The semiconductor device according to claim 1, wherein the upper switch and the lower switch are placed in vertical line along a second direction orthogonal to a first direction in which the first side and the second side extend, as viewed in plan view.

10. The semiconductor device according to claim 1, wherein the power ground terminal is placed between a plurality of the power supply terminals as viewed from a direction orthogonal to the first side.

11. A semiconductor device comprising:

a package having a rectangular shape as viewed in plan and including a first side, a second side parallel to the first side, a third side orthogonal to the first side as well as the second side, and a fourth side parallel to the third side and orthogonal to the first side as well as the second side;

a power supply terminal provided either on the first side or on the third second side or the fourth side;

a power ground terminal provided either on the second side or on the third side or the fourth side;

a switch output terminal provided on the second side;

an upper switch connected between the power supply terminal and the switch output terminal; and a lower switch connected between the switch output terminal and the power ground terminal, wherein the lower switch is bigger in element size than the upper switch.

12. The semiconductor device according to claim 11, wherein the power supply terminals and the power ground terminals are both provided on the third side or the fourth side, and the power ground terminals are arrayed closer to the second side than the power supply terminals.

13. The semiconductor device according to claim 11, wherein the power ground terminal is placed between a plurality of the power supply terminals as viewed from a direction orthogonal to the first side.

14. A semiconductor device comprising:

a package having a rectangular shape as viewed in plan and including a first side, a second side parallel to the first side, a third side orthogonal to the first side as well as the second side, and a fourth side parallel to the third side and orthogonal to the first side as well as the second side;

a power supply terminal provided either on the first side or on the second side;

a power ground terminal provided either on the first side or on the second side;

a switch output terminal provided on the second side;

an upper switch connected between the power supply terminal and the switch output terminal;

a lower switch connected between the switch output terminal and the power ground terminal; and an output feedback controller for driving the upper switch and the lower switch in such fashion that an output current fed from the switch output terminal to a load agrees with a predetermined value.

15. The semiconductor device according to claim 14, wherein the output feedback controller performs output feedback control of a bottom-detection on-time fixed method.

16. A module comprising:

a printed circuit board;

the semiconductor device according to claim 14, the semiconductor device mounted on the printed circuit board; and the load which is supplied with an output current from the semiconductor device.

17. The module according to claim 16, wherein:

the semiconductor device is mounted on a first main surface of the printed circuit board;

a power supply line connected to the power supply terminal, a power ground line connected to the power ground terminal, and a switch output line connected to the switch output terminal are laid down on a second main surface of the printed circuit board.

18. The module according to claim 17, wherein main trunk portions of the power supply line and the power ground line are laid down in parallel and along a first direction in which the first side and the second side extend, as viewed in plan view.

19. The module according to claim 18, wherein a plurality of the above-defined semiconductor devices are mounted along the first direction on the first main surface.

20. The module according to claim 17, wherein at least one of the power supply line and the power ground line is laid down so as to overlap with the semiconductor device, as viewed in plan view.

21. The module according to claim 17, wherein on the second main surface, a bypass capacitor is connected between the power supply line and the power ground line.

22. The module according to claim 21, wherein the bypass capacitor is mounted so as to overlap with the semiconductor device as viewed in plan view.

23. The module according to claim 21, wherein the bypass capacitor is mounted at a position where a closed loop formed in cooperation with the upper switch and the lower switch is minimized.

24. The module according to claim 16, wherein the power supply terminal, the switch output terminal, the power ground terminal, these terminals being provided for each one of the plurality of channels, as well as discrete components externally attached to these terminals are placed in symmetry between at least two channels.

25. The module according to claim 16, further comprising a heat sink attached to the semiconductor device.

26. The module according to claim 16, wherein the semiconductor device and at least part of discrete components externally attached to the semiconductor device are both mounted coplanarly on one surface of the printed circuit board.

27. The module according to claim 26, further comprising a heat sink attached in common to both the semiconductor device and the discrete components mounted coplanarly on one surface of the printed circuit board.

28. The module according to claim 16, further comprising a booster circuit for generating a boost voltage from a battery voltage and feeding the boost voltage to the power supply terminal.

29. The module according to claim 16, wherein the load is a light-emitting diode.

30. The semiconductor device according to claim 14, wherein the power ground terminal is placed between a plurality of the power supply terminals as viewed from a direction orthogonal to the first side.

* * * * *